United States Patent [19]

Farnbach

[11] Patent Number: 4,965,800
[45] Date of Patent: Oct. 23, 1990

[54] DIGITAL SIGNAL FAULT DETECTOR
[76] Inventor: William A. Farnbach, 10049 Mesa Madera, San Diego, Calif. 92131
[21] Appl. No.: 255,352
[22] Filed: Oct. 11, 1988
[51] Int. Cl.$^5$ .............................................. G01R 31/28
[52] U.S. Cl. ...................................... 371/22.1; 371/6
[58] Field of Search ................. 371/15.1, 16.1, 6, 22.1
[56] References Cited

U.S. PATENT DOCUMENTS

| | | | |
|---|---|---|---|
| 3,453,593 | 8/1965 | Hobbs | 371/37.9 |
| 3,510,786 | 5/1970 | Paulson | 328/155 |
| 3,573,638 | 4/1971 | Cox, Jr. et al. | 328/115 |
| 3,786,276 | 1/1974 | Rosch | 307/208 |
| 3,786,358 | 1/1974 | Fiorino | 328/138 |
| 3,859,513 | 1/1975 | Chuang et al. | 371/36 |
| 4,107,651 | 8/1978 | Martin | 371/6 |
| 4,271,535 | 6/1981 | Fukuhara et al. | 455/309 |
| 4,305,091 | 12/1981 | Cooper | 358/36 |
| 4,481,628 | 11/1984 | Pasquinelli | 371/28 |
| 4,495,621 | 1/1985 | Nakagomi et al. | 371/6 |
| 4,713,813 | 12/1987 | Sugimori et al. | 371/22.1 |
| 4,730,314 | 3/1988 | Noguchi | 371/22.1 |

OTHER PUBLICATIONS

Mullin, Mike, "Logic Analyzers", *Electronic Design*, Nov. 21, 1985, pp. 149–155.
Greenfield, Joseph D., *Practical Digital Design*, John Wiley and Sons, 1983, pp. 312–322.
Ciarcia, Steve, "Build a Low-Cost Logic Analyzer", BYTE, Apr., 1981, pp. 36–44.
Brock, Gary, "Logic-Analyzer 'Computer' Simplifies Computer Testing", Electronic Design, Jun. 25, 1981, pp. 101–108.
Namogostar, M., *Digital Equipment Troubleshooting*, Reston Publishing Company, Inc., Reston, VA, 1977, Chap. 3, (pp. 74–62) and Chap. 7, (pp. 139–149).
*Biomation Logic Analyzers*, Introduction and Summary of Logic Analyzer (15 pages).
*Biomation Logic Analyzers*, Model K100-D Digital Logic Analyzer (8 pages).
*Biomation Logic Analyzers*, Model 1650-D Logic Analyzer (6 pages).
*Biomation Logic Analyzers*, Model LA5000 50 MHz Logic Analyzer (8 pages).
*Biomation Logic Analyzers*, Model 9100-D Digital Logic Analyzer (6 pages).
*Hewlett-Packard Products*, Model 1631 A/D, 1630 A/D/G (10 pages).
*Hewlett-Packard Products*, HP 54100-series, Models 5183T,U and 5180T,U (9 pages).
*Hewlett-Packard Products*, HP 64000-UX Microprocessor Development Environment (2 pages).
*Hewlett-Packard Products*, HP 545A TTL/CMOS Logic Probe (1 page).
Phillips Test and Measuring Instruments, Inc. (28 pages).
Information on Data Test Equipment, including Models PM3540, PM3543, PM3551A, PM8810, PM8811, and PM3305 Tektronix (26 pages).

*Primary Examiner*—Charles E. Atkinson
*Attorney, Agent, or Firm*—Knobbe, Martens, Olson & Bear

[57] ABSTRACT

The present invention comprises an electrical test circuit for testing a signal in a digital circuit, to detect common analog signal deficiencies or "faults". More specifically, the test circuit can simultaneously detect one or all of three such faults in a digital circuit, including: (1) a voltage spike which occurs when the signal briefly jumps either high or low; (2) a float fault which occurs when the signal is floating for too long; and (3) a noise fault which occurs when the signal passes from either the high or the low state to the float state, and then returns directly to the same state. The signal to be tested is first processed in an input state discriminator to classify by state, either high, low, or float. In a preferred embodiment, both the high voltage threshold and the low voltage threshold of the input state discriminator are adjustable separately to accommodate all logic families. Following classification, three circuits test simultaneously for the appearance of the three separate faults, each circuit testing for a different fault. The spike fault circuit and the float fault circuit each include an adjustable timer, logic, and a comparator to test for the respective fault. The noise fault circuit includes logic to test for a noise fault. Thus, the present invention is adaptable for testing virtually any digital circuit, operating asynchronously or at any of a wide variety of frequencies. The present invention can be used alone as a device to verify proper digital circuit operation, or it can be used in combination with another testing device such as a logic analyzer.

62 Claims, 10 Drawing Sheets

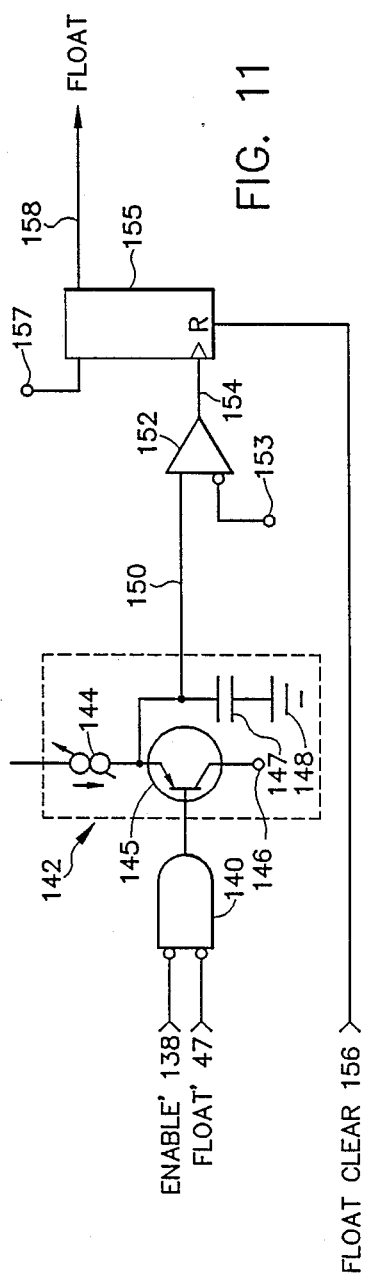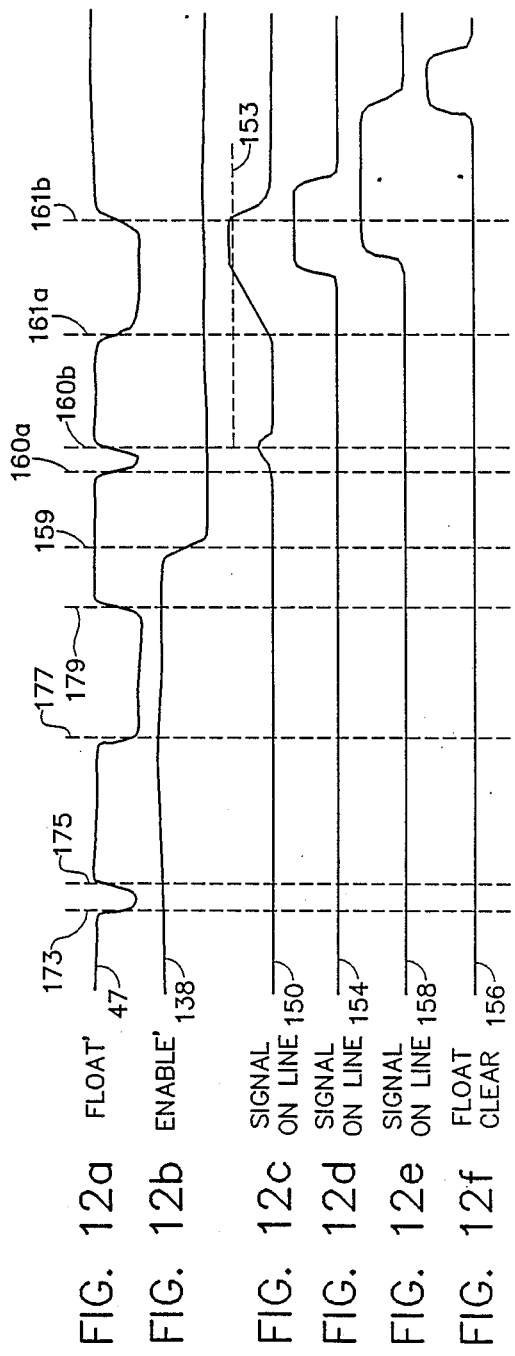

DIGITAL SIGNAL FAULT DETECTOR

BACKGROUND OF THE INVENTION

1. Field of the Invention

The present invention relates to electrical circuits generally, and to devices for analyzing and testing the operation of digital circuits. More particularly, the invention relates to devices for continuously monitoring the analog qualities of a signal in a digital circuit, to simultaneously detect certain signal characteristics that may indicate an error in circuit operation.

2. The Prior Art

Within the past twenty years, the use of digital circuits has dramatically expanded beyond the scientific community into most business establishments. For example, the average office at the present time typically utilizes one or more word processors whose basis of operation is digital circuitry. Small offices may have one word processor to simplify typing tasks. Larger businesses may have hundreds of word processors, as well as other computers devoted exclusively to tasks such as accounting and inventory control. Communications engineers typically use digital circuits to transmit information more efficiently, more accurately, and more quickly than possible with any traditional analog method. High fidelity audio enthusiasts have created a huge market for the compact disk, which stores millions of bits of information. After being read by a laser scanning device, these bits are processed into waveforms of music, which are transmitted to the listeners' ears as crystal clear sound. All of the above applications, and many more, depend upon digital circuitry for their existence. In the future, the diverse applications of digital technology are expected to again increase dramatically, as the components and their applications become faster, more reliable, and more generally available to the public.

Digital circuitry operates on the binary principle of being either "on" or "off," as represented by ones and zeros. Groups of signals which each comprise only ones or zeros are combined to form information which is used in operation of the circuitry. For example, each combination may represent data or it may represent a control instruction.

Utilizing these combinations, a microprocessor can be used to perform functions and process data at extremely high clock rates, typically at 1 MHz or more, which is equivalent to 1 million pulses per second. These pulses are then used to pace the operation of the circuit. At these high speeds and with the resultant high volume of data instructions being processed, the consequences of an error most likely will not be discernable at the time the error occurs; instead the results of an error may make an appearance only at the end of execution of a long series of instructions, or a "run" of the program. Even then, the existence of an error may not be known to the user until after several runs are complete and after someone happens to notice an inconsistency in the data or results. In summary, the lightning fast speed of data processing, together with the increasing complexity of data processing machines and digital technology, has made the detection of errors occurring during operation of digital circuits increasingly difficult.

Faced with an unknown error, the troubleshooter and/or designer of digital systems must address and resolve problems in at least two basic areas: (1) the logic of the circuit; and (2) the implementation of the circuit in hardware, with basic building blocks such as "AND" gates, "OR" gates and flip-flops. Due to the increasing complexity of the operation of a digital circuit, and in light of the huge amounts of data and information being transferred every second, finding an error can often be likened to the proverbial "finding a needle in a haystack." The second type of problems, those involving hardware, such as a faulty flip-flop, are commonly evidenced by certain characteristics of the signals passing between two or more digital components, such as the signal between an output of an OR-gate and a clock input of a flip-flop. These certain signal characteristics that may evidence an error condition will be termed a "fault."

A fault may cause an error in computing when a digital component, such as an AND gate or a flip-flop assigns an improper binary value to a signal at an input, for example, a "one" instead of a "zero" or a "zero" instead of a "one." A digital circuit will recognize a "one" if the applied signal is above a certain voltage level; in that case, the signal is said to be in the "high" state. Similarly, a "zero" will be recognized by that component if the signal voltage is less than another specified voltage level; in that case, the signal is said to be in the "low" state. If the signal is in a voltage range lying between the high and low states, the signal is said to be in the "float" state.

Many devices presently exist for analyzing the operation of digital circuits, including the logic probe, the logic analyzer and the digital oscilloscope.

The logic probe comprises digital circuitry that displays the state of the signal to which it is connected. Often, two LEDs are provided: one to indicate a high state, the other to indicate a low state. If neither is lighted, the signal is in the float state.

Some logic probes have an additional feature which allows them to "capture" pulses. Such a probe can be used to detect the existence of pulses where none should exist. However, logic probes cannot detect the existence of a bad pulse among a number of good pulses. For example, the commercially available Hewlett Packard Model 545A TTL/CMOS Logic Probe has an independent, built-in pulse memory with LED display. To utilize this feature, the memory must be reset, and the probe connected to the circuit point. A pulse will light the LED, which then remains on until reset. As another feature, the probe also indicates a return to an initial valid level from a bad level for a pulse with a period greater than or equal to 1 μsec.

Another type of digital measuring instrument is the logic analyzer, which is connected to the tested circuit by a number of probes or "grabber connections" each of which acts as a simple connection without the more advanced features of the Hewlett Packard Logic Probe described above. In their connection with a logic analyzer, these probes are often grouped together in groups of eight, termed a "Probe Pod." An example of such a probe pod is the commercially available Biomation Model K100-D/10 Probe Pod. In that model, eight grabber connections are provided for connection to the circuit, and the high and low thresholds are selectable by the user. One or more pods may be connected to the logic analyzer to monitor the necessary number of connections.

In general terms, a logic analyzer is used to record and display the sequence of signal states appearing at each grabber connection of the probe pod. An internal clock is provided, so that the state of each connection is recorded with each clock pulse. The rate of the clock is generally selectable by the user, up to a maximum typically beyond 100 MHz. At 100 MHz, it requires 1 megabyte of memory to store eight channels of data for 10 ms. An operator, analyzing this data, may spend several hours analyzing the data captured in 10 ms.

The data capture may be started or stopped by many different means, such as a specific combination of data inputs to the pod. Some logic analyzers have been designed to trigger upon the detection of a voltage spike. For example, several Biomation Logic Analyzers, such as the Model 1650-D, feature a latch mode which allows monitoring of data between clock edges. When such a spike is detected between clock edges, the latch mode allows display of their relative timing with respect to other recorded signals. Voltage spikes as narrow as 5 nsec can be detected. One disadvantage of the latch mode is that it does not monitor spikes that may coincide with a clock pulse, and therefore the latch mode cannot continuously detect spikes that occur on a line. Another disadvantage is that the displayed time resolution of each spike captured is limited to the clock interval selected for recording and also the display mechanism is not easily readable by someone not familiar with the Biomation Logic Analyzer.

As another example of a logic analyzer with spike detection capabilities, the Hewlett-Packard Model 1631 A/D Logic Analyzer with scope provides the ability to trigger upon the existence of a spike, a pulse shorter than a preselected time interval. Of course, the operator must know which signal to use as a trigger; otherwise, he must look through vast amounts of data in hopes of seeing the spike. The 1631 will also record a spike as a legitimate pulse if it occurs at a clock edge.

In addition to the problems identified above, problems inherent in use of the logic analyzer include the high cost of the equipment, the specialized knowledge necessary to operate a logic analyzer effectively, and the huge amounts of information collected by the logic analyzer which must be reviewed to find a hidden error. After triggering on a spike, the subsequent data accumulated by the logic analyzer must be reviewed in an attempt to determine the source or cause of the error, often with great expense of time. Furthermore, it may be noted that, in general, when using a logic analyzer for troubleshooting, the focus is upon determining the cause of a specific error.

Another type of instrument used to test digital circuits is the oscilloscope, which draws a trace of the signal under test on an oscilloscope screen or CRT. Since each trace only lasts about a microsecond, the eye sees the average of several hundred thousand traces; a single bad trace is usually missed altogether. Even if the problem is repetitive with a period of 10 ms, it would take several hours to examine the data generated by the system under test during the 10 ms period.

A disadvantage, common to both oscilloscopes and logic analyzers, is that both gather data only intermittently, hence they may miss an infrequent problem. For example, both oscilloscopes and logic analyzers miss information that occurs between traces; further, logic analyzers miss information that falls between two sampling times.

In view of the above, it would be an important improvement in the art to provide a testing device which is responsive only to signal characteristics commonly indicative of an error, so that the focus of trouble shooting may be directed to that error. It would be a further improvement to provide a testing device which can detect such error-indicating signal characteristics that occur intermittently or within an extremely short time interval. It would be an even further improvement to provide such a testing device which is inexpensive, and easily usable by technically unskilled users. Such a device could have applications beyond troubleshooting. For instance, the testing device could be used as a standard testing device in factories that produce digital components or semiconductor chips.

SUMMARY OF THE INVENTION

The present invention comprises a fault detector for monitoring signals in a digital circuit. In operation, the fault detector of the present invention is advantageous because it substantially continuously monitors the desired signal to detect one or more common analog signal deficiencies ("faults") appearing on the monitored signal. In the preferred embodiment, virtually any fault can be detected continuously. After a fault is detected, there is a short reset time while the fault is being counted during which that fault will not be detected. In this context a "fault" may be defined as any undesired analog behavior on a signal passing between two or more digital components.

In digital circuits, a fault appearing on a signal is a strong indication that the circuit may function improperly immediately or under slightly different conditions. The actual cause and exact nature of the fault may be unknown, however, often it is related to either the logic of the circuit design, or a problem with the electrical components comprising the digital circuit More particularly, the fault detector comprises an electrical testing device having a spike detector, a float detector, and a noise detector. When these three detectors are combined in the preferred embodiment, virtually any signal fault will be detected.

The spike detector comprises a means for defining a spike time period, a means for identifying the state of the signal as high or low, a means for measuring the continuous duration of the signal in the high or the low state and for comparing it with the predetermined spike time, and a means for communicating that the continuous duration of the signal in the high state or the low state is less than the spike time.

The float detector comprises a means for defining a float time period, a means for identifying the float state, a means for measuring the continuous duration of the float state and for comparing it with the predetermined float time period, and a means for communicating that the continuous duration has exceeded the float time period.

The noise detector comprises a means for identifying a transition between the float state and low state, and between the float state and high state, means for detecting and communicating either that the signal made a transition from the high-to-float state and then to the high state without entering the low state, or that the signal made a transition from the low-to-float state and then to the low state without entering the high state. The present invention comprises any one or any combination of these detectors.

Thus, the fault detector of the present invention provides simultaneous detection of the existence of each of the spike, float, and noise faults and generates a characteristic signal which provides the opportunity for storage or immediate display to the user and provides the capability for accumulation of the number of faults and the particular types of faults monitored on the signal.

The fault detector of the present invention detects only those analog signal conditions which have been predetermined by the user to be improper; or faults. Therefore, the fault detector allows the user to focus upon the faults themselves. The user of an embodiment of the present invention is therefore not required to search through large amounts of good data in order to find the cause of an error.

The fault detector can be used in combination with a logic analyzer or alone as, for example, a device to verify proper digital circuit operation. Adjustability of parameters is provided for flexibility of determination of the type and duration of signal conditions that are to be considered improper, and to allow use in a wide range of applications, such as the testing of digital circuits operating within a wide range of clock frequencies, or the testing of digital circuits operating asynchronously.

These and other advantages and features of the present invention will become more fully apparent from the following description and appended claims taken in conjunction with the accompanying drawings.

BRIEF DESCRIPTION OF THE DRAWINGS

FIG. 1 is a graphical illustration of an input signal with respect to an interval of time, the input signal exhibiting first a normal high-going pulse and then a high-going spike.

FIG. 11 is a circuit diagram illustrating a preferred embodiment of the float fault detector of the present invention.

FIGS. 12a–12f are graphical illustrations of a example voltage over time at six selected nodes of the float fault detector in a preferred embodiment of the present invention.

DETAILED DESCRIPTION OF THE PREFERRED EMBODIMENT

The invention is best understood by reference to the figures wherein like parts are designated with like numerals throughout.

The present invention comprises a digital signal fault detector having one or more electrical circuits that can simultaneously detect one or more types of improper analog behavior on any input signal in a digital circuit. For purposes of this discussion, an input signal may assume any of an infinite variety of waveforms, and therefore the specific examples chosen for an input signal are exemplary. The detected characteristics of the input signal defining a "fault," include: (1) a voltage spike; (2) a float fault; and (3) a noise fault. The meaning of each of these faults can be understood in light of the following discussion.

As noted previously, any of these faults may cause an error if an input to a digital component recognizes an improper binary value such as a "one" instead of a "zero," or a "zero" instead of a "one." The binary value recognized by the digital component depends upon the voltage level of the signal.

Figure 1:
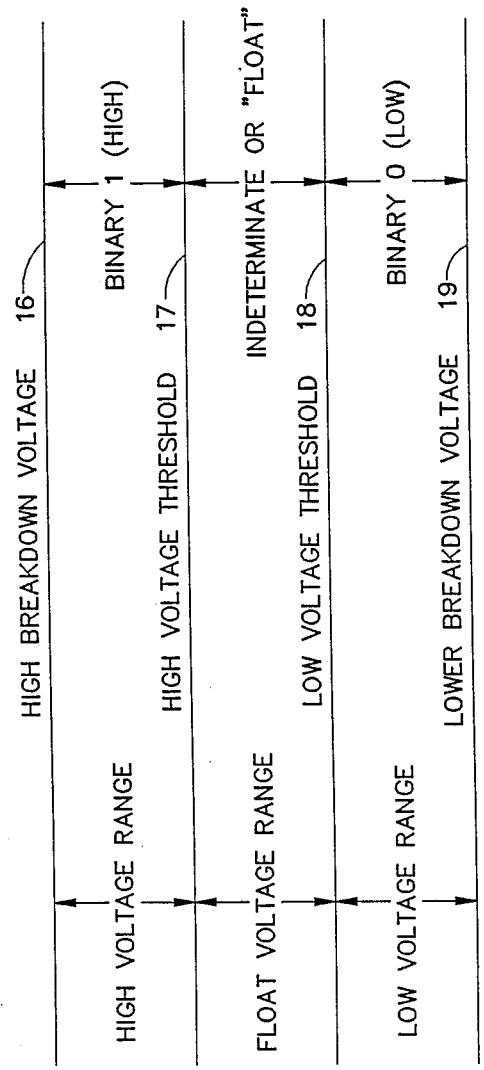
FIG. 1 is a graphical illustration of the relationship in a digital circuit between the high voltage threshold, the low voltage threshold, and the voltage levels recognized by the digital circuit with respect to these voltages.

With reference to FIG. 1, it can be seen that any input signal having a voltage within the high voltage range (above a high voltage threshold 17 and below an upper breakdown voltage 16) is associated with a binary "one" and, similarly, any signal with a voltage within the low voltage range (below a low voltage threshold 18 and above a lower breakdown voltage 20) is associated with a binary "zero." Thus, when a "one" is recognized by a digital component, the signal is said to be in the high state ("high"), and when a "zero" is recognized, the signal is said to be in the low state ("low"). However, the value recognized by the digital component is uncertain or indeterminate if the signal voltage is above the low threshold 18, and also below the high threshold 17. In that voltage range, the signal is said to be in the float state ("float"). Therefore, a digital signal at any specific point in time will be classified in only one of three states: the high state, the low state, or the float state.

As an illustration of the use of the above terminology, when an output signal of a particular component is in the high state, it is said that the specified output is high, and similarly when an input signal of a component is in the high state, it is said that the specified input is high. When an output signal of a particular component is in the low state, it is said that the output is low, and when an input signal is in the low state, it is said that the input is low. Also, when an output signal of a particular component is in the float state, it is said that the output is floating and when an input signal is in the float state it is said that the input is floating.

The specific voltage levels corresponding to the high threshold and the low threshold may both vary depending upon the family of components used or upon the specific application. For example, in transistor-transistor logic (TTL), a commonly used component family, the high threshold voltage may be +2.0 volts and the low threshold voltage may be +0.8 volts.

Figure 2:
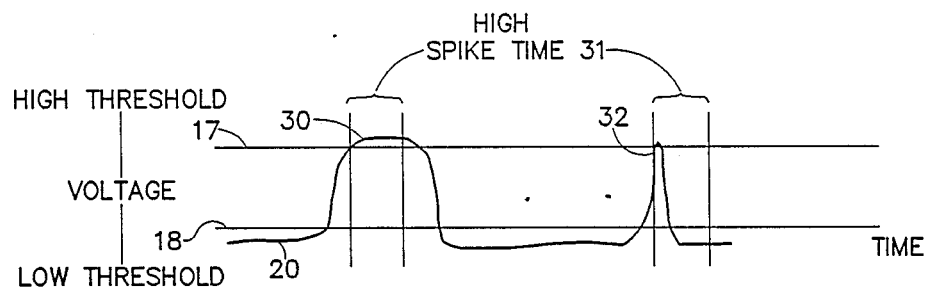

The first type of fault discussed is the voltage spike, which is characterized by its short duration. For example, within a few nanoseconds, the voltage of a signal carrying the voltage spike may first pass above the high threshold and then return below it. By comparison, in a normal transition to the high state, the digital signal will remain in the high voltage range for tens, or even hundreds of nanoseconds depending on factors such as the speed and the family of components used. Referring to FIG. 2, an input signal 20 exhibits a typical non-spike pulse 30 whose duration above the high voltage threshold 17 is greater than a predetermined high spike time 31. For comparison, input signal 20 also exhibits a spike pulse 32, with a duration less than the high spike time 31.

Figure 3:
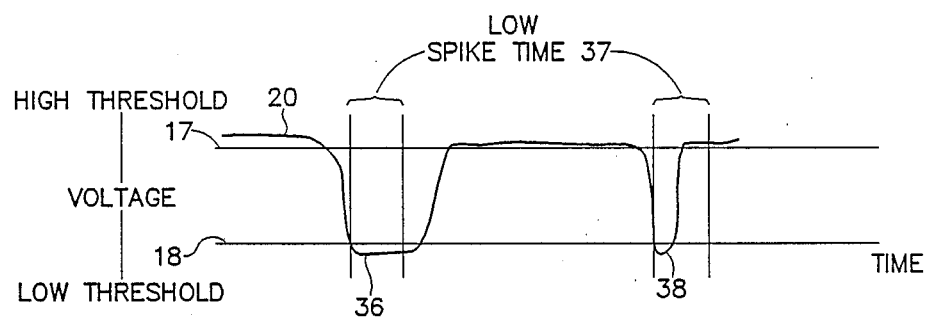
FIG. 3 is a graphical illustration of an input signal with respect to an interval of time, the input signal exhibiting first a normal low-going pulse and then a low-going spike.

As illustrated in FIG. 3, a voltage spike also occurs when the voltage of the input signal 20 drops into the low state for a duration less than a predetermined low spike time 37. In FIG. 3, the input signal 20 exhibits a typical non-spike pulse 36 with a duration longer than the low spike time 37, while a spike is shown by pulse 38 with a duration shorter than the low spike time 37.

As an example of the type of error that can be caused by a voltage spike, if the reset, (or clear) input of a flip-flop experiences a voltage spike, an incorrect value may possibly appear at the output, thereby causing an error if proper operation depends on this value.

The predetermined spike times 31, 37 will vary depending on the application and may be defined after consideration of a number of factors, including the normal operating speed of the circuit and the probability of a normal signal occurring with a duration less than the predetermined spike times 31, 37. Furthermore the high spike time 31 chosen for the high spike in FIG. 2 may be the same time interval, or it may differ from the low spike time 37 chosen for the low spike in FIG. 3.

Figure 4:
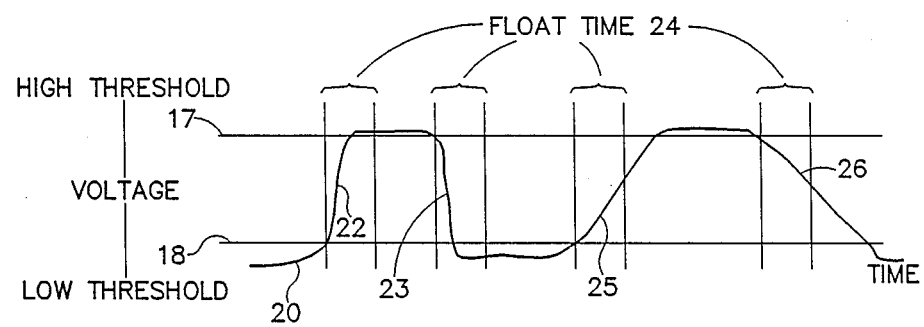
FIG. 4 is a graphical illustration of an input signal with respect to an interval of time, the input signal exhibiting two float faults.

The input signal 20 may exhibit other improper analog properties in addition to the voltage spike. For example, a "float fault" has occurred if, as is illustrated in FIG. 4, the voltage of input signal 20 remains in the float state for more than a predetermined float time 24. Normally, a digital circuit will pass through the float voltage range while making a relatively quick transition from "one" to "zero" or from "zero" to "one," as illustrated by the transitions 22, 23 of an input signal 20. It can be seen that these transitions 22, 23 pass through the float state in a time period less than the float time 24.

A float fault is illustrated by transitions 25, 26 which remain in the float state for a time period greater than the allowed float time 24. If a "float fault" appears on a line, the digital value is uncertain. A digital component can only recognize a "zero" or "one." When a float appears at an input to a digital component, a value of zero or one will be assigned arbitrarily at that input. Thus, if a float fault appears on a control line, the operation performed will be uncertain, and the eventual results may be inconsistent or indeterminate. Similarly, if a float fault were to occur on a data transfer line, the data transferred may have an arbitrary value.

Figure 5:
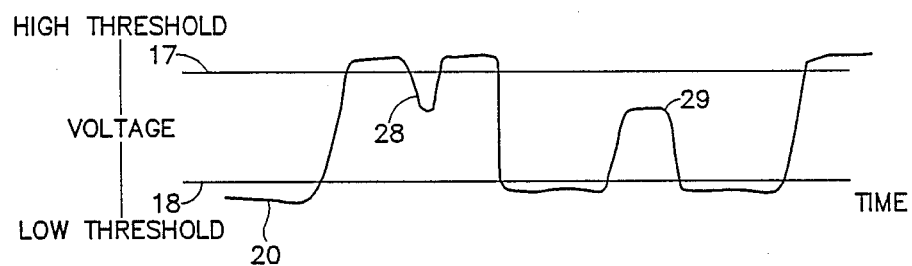
FIG. 5 is a graphical illustration of an input signal with respect to an interval of time, the input signal exhibiting two noise faults.

Another measurable analog signal property that may indicate an error may be termed a "noise fault." As illustrated in FIG. 5, this is the signal property where an input signal 20 leaves the high state and returns to the high state without ever entering the low state as shown by the pulse 28, or conversely where the signal leaves the low state and returns without ever entering the high state as shown by the pulse 29. The noise fault may indicate that noise has been combined with the input signal 20, for example by some external force. The resultant noise may appear as a legitimate pulse to some logic elements, thereby potentially generating an error in the circuit.

Figure 15:
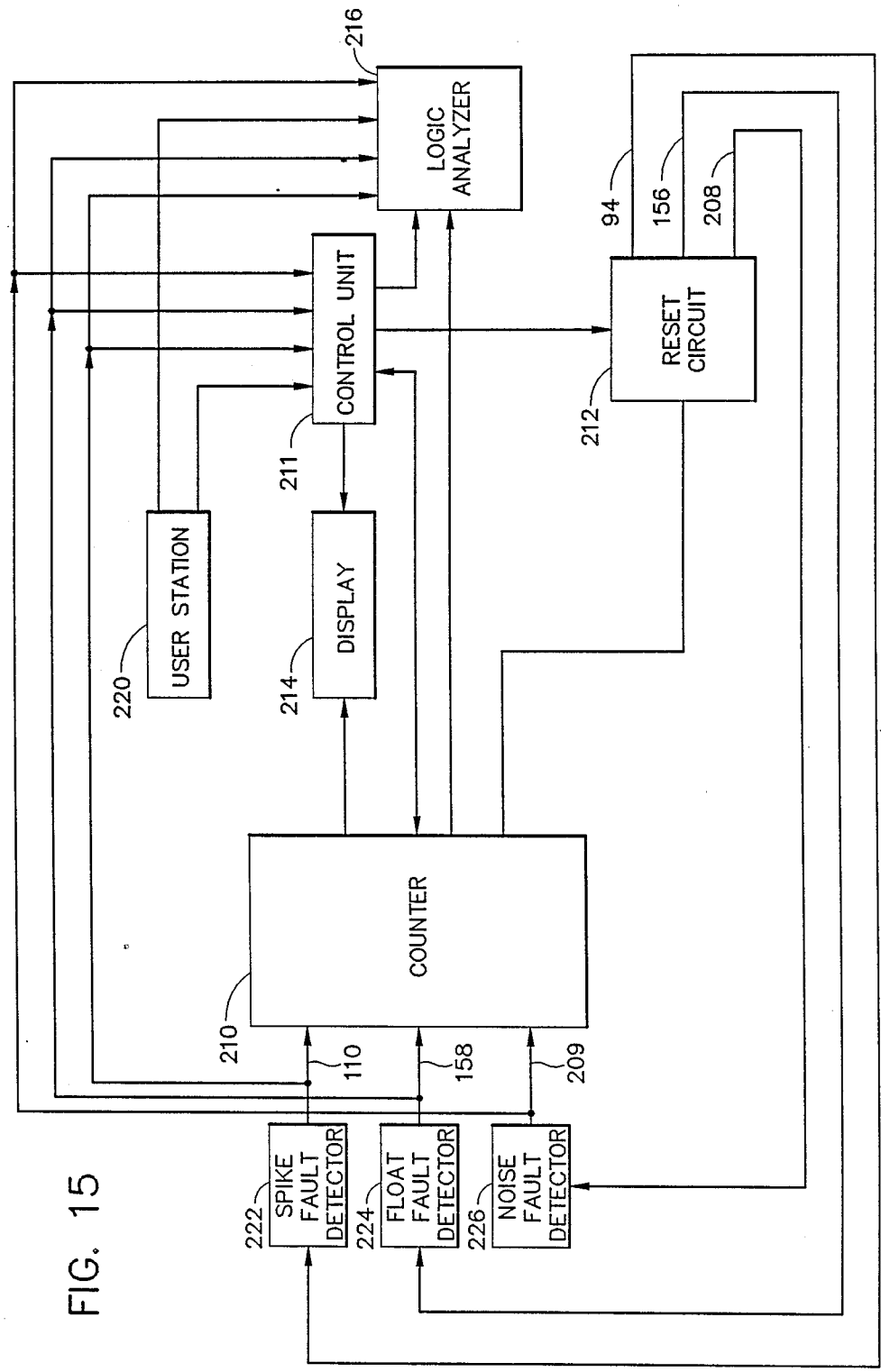
FIG. 15 is a block diagram illustrating another preferred embodiment of the present invention, comprising a circuit incorporating a combination of the spike fault detector, the float fault detector, and the noise fault detector of the present invention.

The fault detector of the present invention comprises a circuit which receives the input signal 20 and processes it by at least one or more detection sections including a spike detection section, a float detection section, and a noise detection section, thereby providing a capability to test for up to three types of analog signal faults simultaneously. FIG. 15 illustrates a fault detector in block diagram, showing these sections and their interconnection. This figure will be described fully following a description of each of the sections. It should be remembered for purposes of this discussion, the input signal 20 is capable of assuming any arbitrary waveform, and any assumptions made concerning its shape or qualities are exemplary only.

Figure 7:
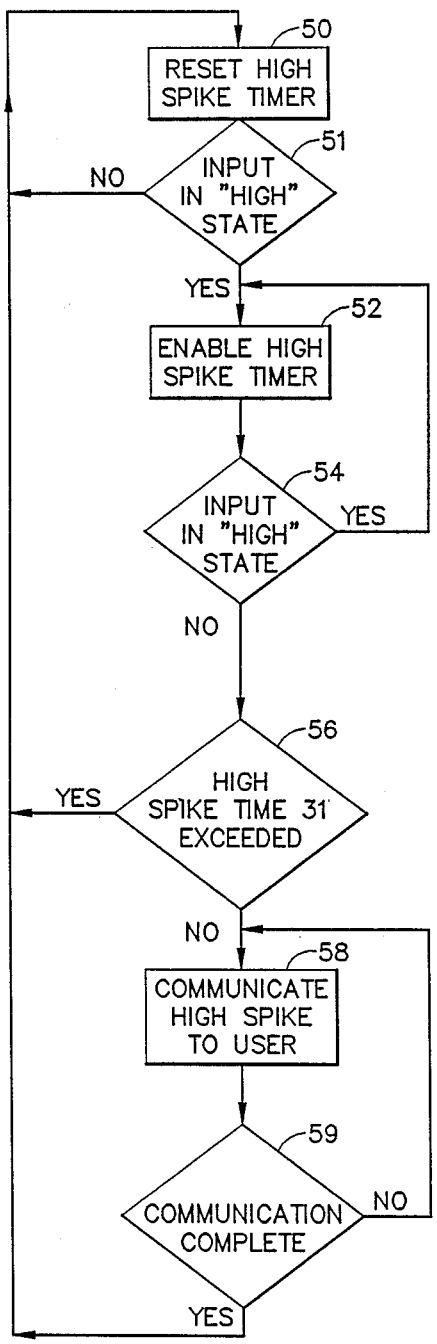
FIG. 7 is a flowchart illustrating the operation of a preferred embodiment of the high spike detector of the present invention.
Figure 8:
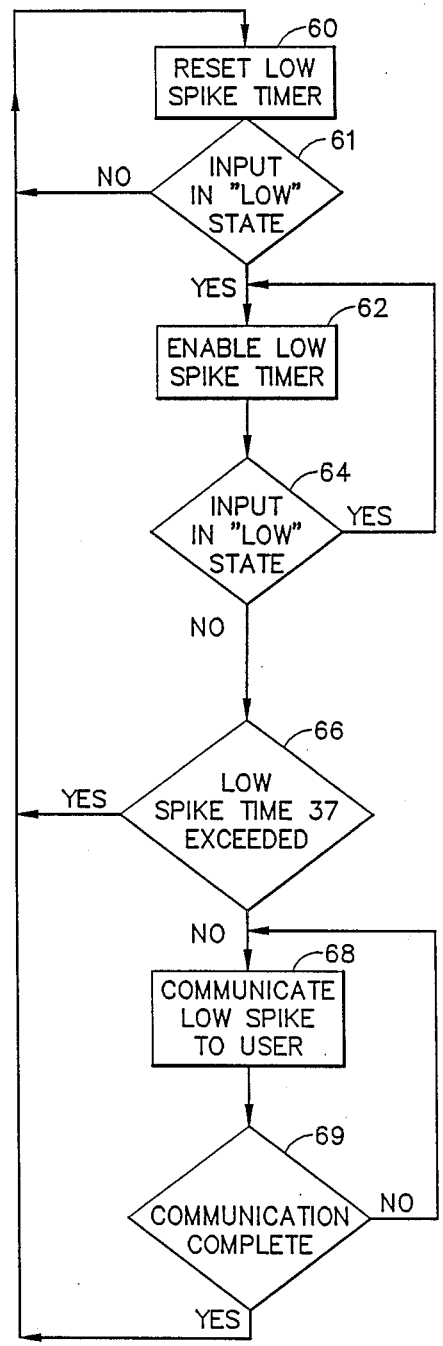
FIG. 8 is a flowchart illustrating operation of a preferred embodiment of the low spike detector of the present invention.
Figure 9:
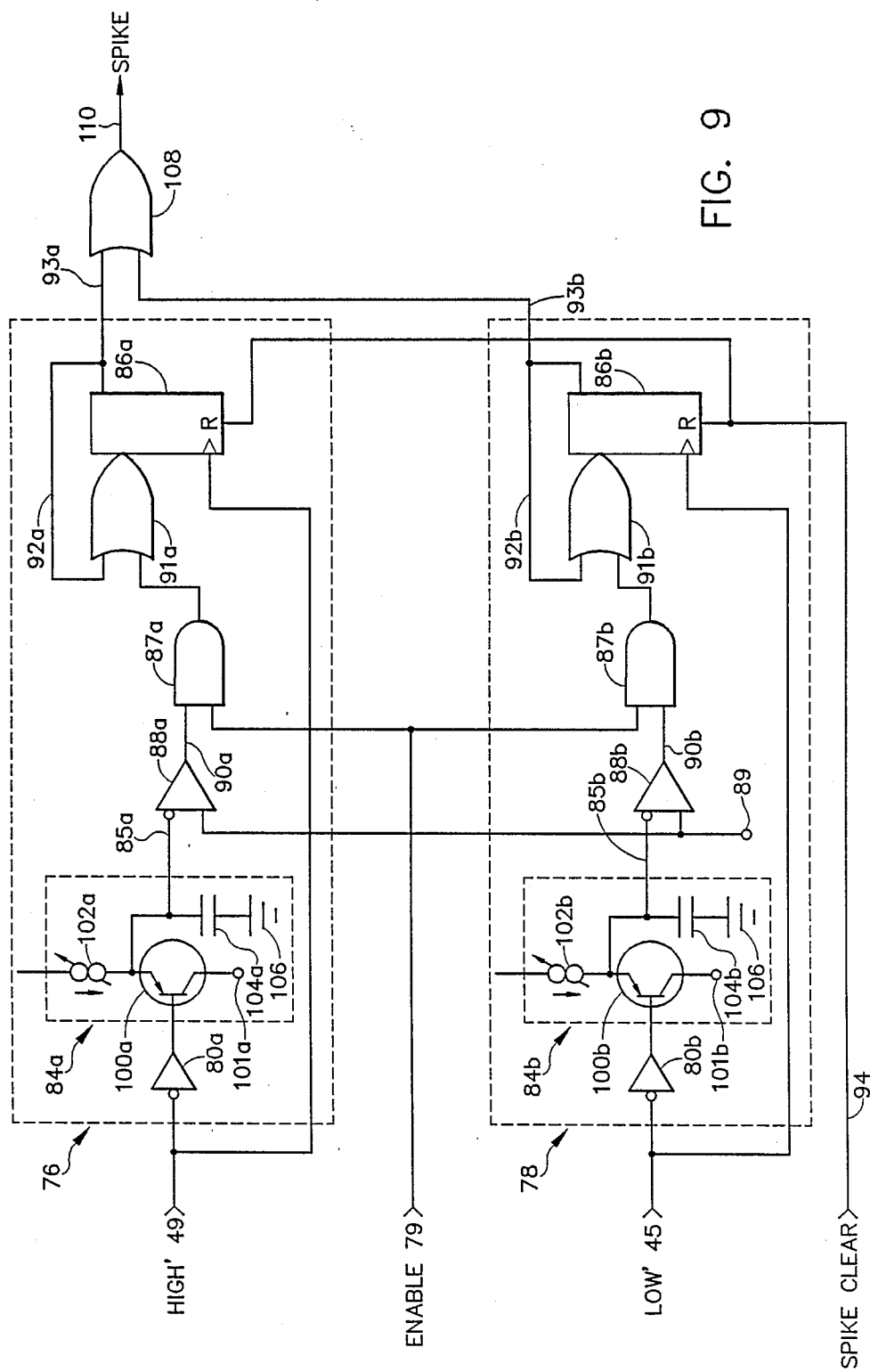
FIG. 9 is a circuit diagram illustrating a preferred embodiment of the spike fault detector of the present invention.

The spike detection section detects the "voltage spike" as previously defined. This section is illustrated in FIGS. 7, 8 and 9, and is described in detail hereinafter. Generally, the spike detection section detects spikes by comparing the time period that the signal remains in either the high state or the low state with the spike time periods 31, 37 (FIG. 2) preselected for the high spike and the low spike, and produces a characteristic signal if the pulse time period is less than the preselected time periods 31, 37.

Figure 10:
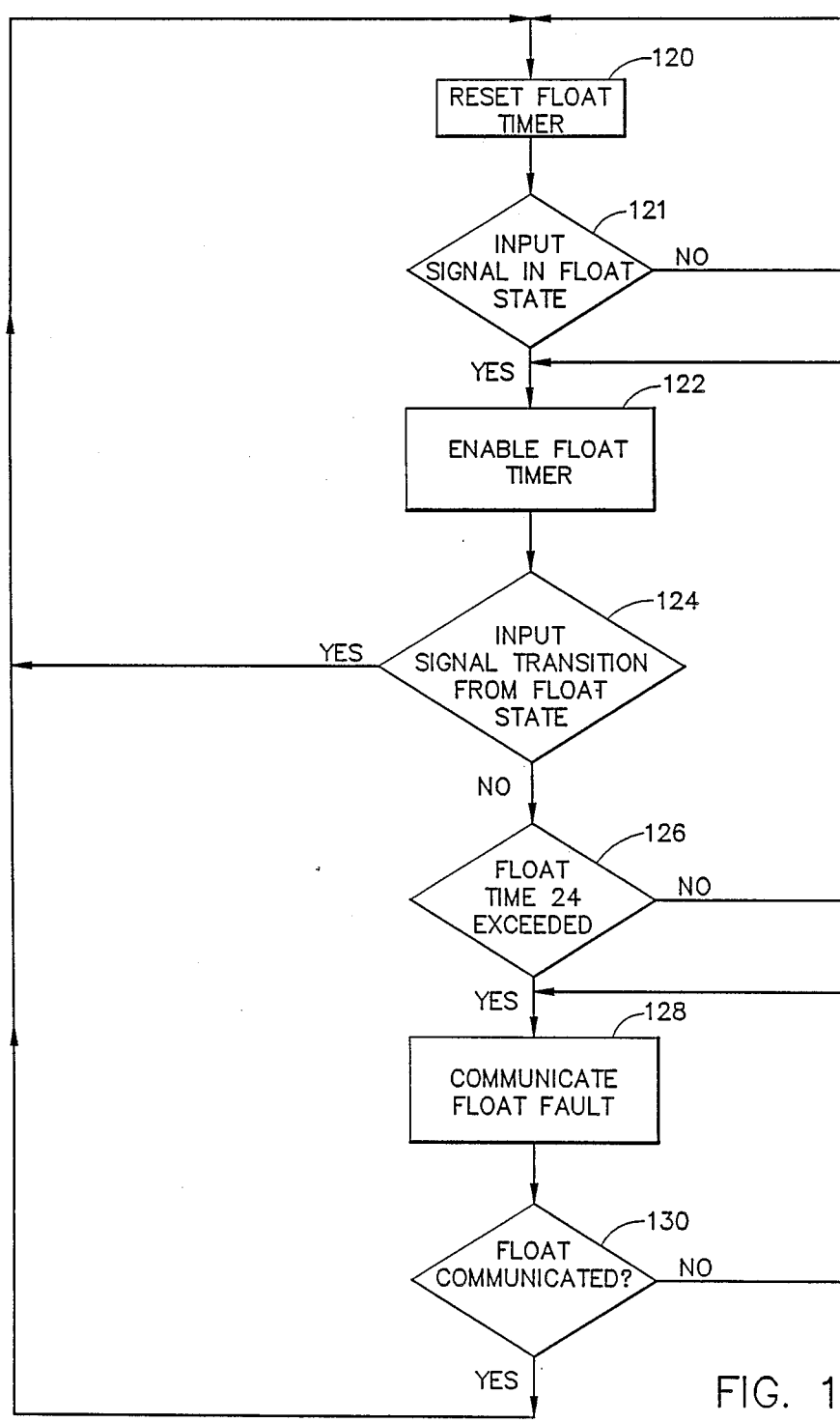
FIG. 10 is a flowchart illustrating operation of a preferred embodiment of the float fault detector of the present invention.

The float detection section detects the "float fault" as previously defined. The float detection section is illustrated in FIGS. 10 and 11, and is described in more detail hereinafter. The float detection section detects a float error by comparing the time period the signal remains in the float state with a preselected float time period 24, (FIG. 4) and produces a characteristic signal if the float time period is greater than the float time period 24.

Figure 13:
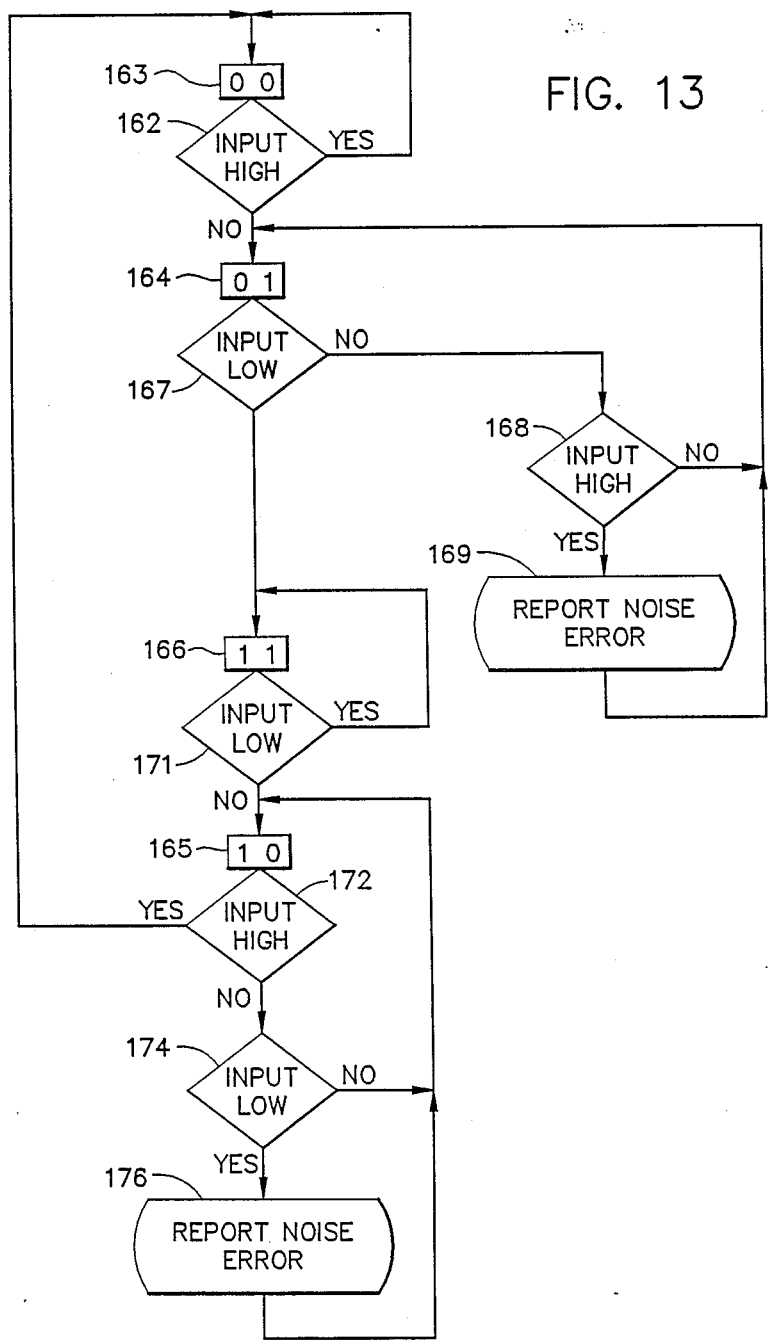
FIG. 13 is a flowchart illustrating operation of a preferred embodiment of the noise fault detector of the present invention.
Figure 14:
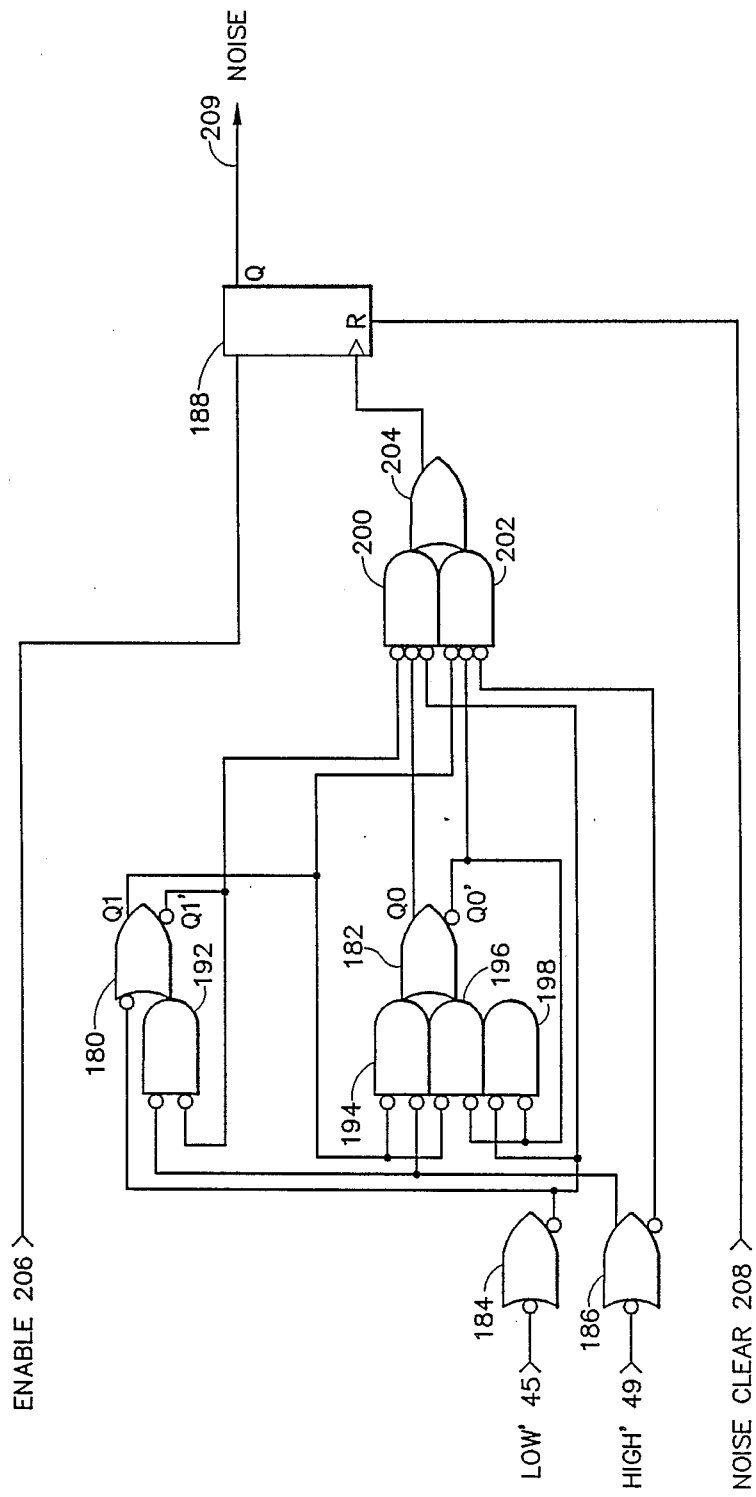
FIG. 14 is a circuit diagram illustrating a preferred embodiment of the noise fault detector of the present invention.

The noise detection section detects the "noise fault" as previously defined. The noise detection section is illustrated in FIGS. 13 and 14, and is described in more detail hereinafter. The noise detection section detects noise by utilizing logic gates to determine if the signal has made either (1) a transition from the low state to the float state and then back to the low state without passing the high threshold or (2) a transition from the high state to the float state and then back to the high state without passing the low threshold.

Figure 6:
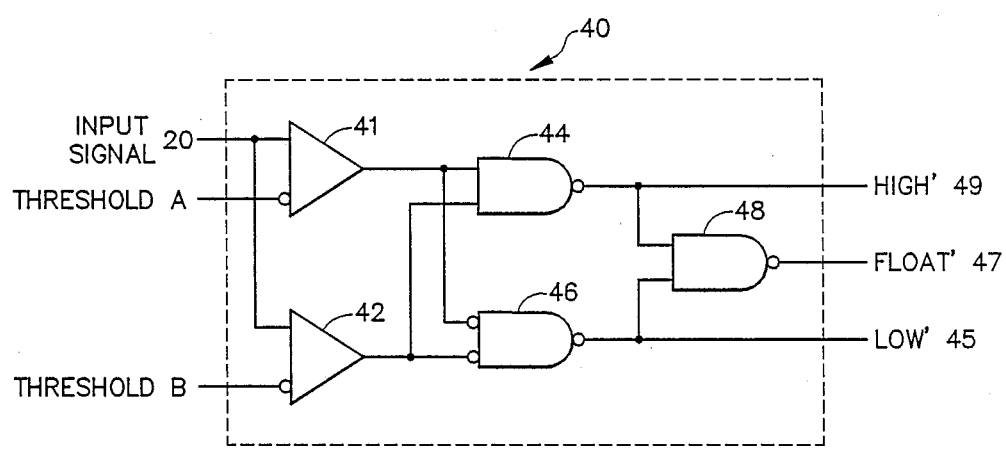
FIG. 6 is a circuit diagram of an input signal state discriminator used to provide input signals to the device of the present invention.

One embodiment of a conventional input state discriminator is shown generally within the dotted lines of block 40 of FIG. 6. The discriminator 40 is used to classify an input signal 20 within one of the following states: high, low or float, similar to the logic probe. Other embodiments of a discriminator 40 are well known in the technology. The discriminator 40 is connected to each of the detection circuits including the spike fault detector shown in FIG. 9, the float fault detector shown in FIG. 11, and the noise fault detector shown in FIG. 14.

Specifically, the discriminator 40 receives the input signal 20 and compares it with two threshold voltages; threshold voltage A and threshold voltage B, one of which is the high threshold voltage, the other of which is the low threshold voltage. For example, threshold A may correspond to the high voltage threshold and threshold B may correspond to the low voltage threshold. Using these inputs, the preferred embodiment of the discriminator 40 provides appropriate output signals designated as low' signal 45, float' signal 47 and high' signal 49, each of which may comprise an infinite variety of waveforms typically present in a digital signal. In accordance with common usage, the prime (') following a signal name indicates that the signal is active when low, i.e., the signal is low when asserted. For example, the high' signal is low when the input signal 20 is high, and high otherwise.

More specifically, within the block 40, the input signal 20 and the threshold A are provided as inputs to a comparator 41. Also, the input signal 20 and threshold B are provided as inputs to a comparator 42. Accordingly, the input signal 20 is compared with the threshold voltage A in the comparator 41, and simultaneously compared with the threshold voltage B in the comparator 42. The inputs of each comparator 41, 42 are so connected that if the voltage of the input signal 20 is above the respective threshold A or B, the output signal of the respective comparator 41 or 42 will be in the high state. However, if the voltage level of the input signal 20 is below the respective threshold, the output signal of the respective comparator 41, 42 will be in the low state.

The output of the comparator 41 is connected to an input of a NAND gate 44, and the output of the comparator 42 is connected to the other input of the NAND gate 44, which provides an output signal high' 49. For example, if both outputs from both comparators 41 and 42 are in the high state (i.e., the input voltage is above thresholds A and B), the NAND gate 44 will generate the output signal high 49 in the low state indicating that the input signal 20 is high. The outputs of the comparators 41, 42 are also inverted and connected to the inputs of a NAND gate 46 whose output signal is low' 45. For example, if the outputs of both comparators 41, 42 are low (i.e., the input signal 20 has a voltage below both thresholds A and B), the NAND gate 46 will generate the low' signal 45 in the low state indicating that the input signal 20 is low.

The outputs of the NAND gates 44, 46 are connected to the inputs of NAND gate 48, which generates a signal float' 47. For example, if the output of either of the comparators 41, 42 is high, while the other is low, both of the NAND gates 44, 46 will provide an output signal in a high state, causing the NAND gate 48 to put out a low signal indicating that the input signal 20 is in the float state. Thus, the discriminator 40 categorizes the input signal into one of three states: high, low or float.

It should be noted that each of the thresholds A and B represent voltage sources, one corresponding to the high voltage threshold and the other corresponding to the low voltage threshold. Both sources A and B, preferably, are adjustable by any known means so that the user may independently determine the low threshold and the high threshold needed for the particular circuit application. It should be apparent that, for purposes of the input signal state discriminator 40 noted in FIG. 6, the threshold A can comprise either the low or high threshold level, with the threshold B comprising the other threshold level.

In one preferred embodiment of the invention, the high' signal 49 is connected to a high spike detector (not shown in FIG. 6), whose method of operation is illustrated in the flowchart of FIG. 7 and whose circuit is shown in FIG. 9. Referring to FIG. 7, a description begins with a state block 50, which indicates the state of the detector, while the decision indicated in a decision box 51 is made, as to whether or not the input signal 20 is in the high state. From FIG. 7, it can be seen that in the state 50 described above, the high spike detector remains idle and the high spike timer remains continually reset, awaiting a transition of the input signal 20 to the high state. Upon detecting this transition, the high spike detector moves to a block 52, and the high spike timer is enabled. Operation of the detector remains in the block 52, and the timer remains enabled until the decision box 54 determines that the input signal 20 is no longer in the high state. Once the input signal 20 moves from the high state into the float or low state, the detector exits from the block 52 and the decision block 54, and makes the decision illustrated in the box 56, the decision being whether or not the high spike time 31 has been exceeded. The detector moves to state block 50 if the spike time has been exceeded or to block 58 if it has not been exceeded.

If the high spike time 31 has been exceeded, the transition is not a voltage spike, so decision block 56 returns the detector to the reset state block 50. If, however, the high spike time 31 has not been exceeded, a voltage spike has been detected and the decision block 56 moves the detector to block 58 wherein the existence of a high spike is communicated to the user. In the preferred embodiment, the detector remains in block 58 until a decision block 59 determines that a reset signal has been received, i.e., that the communication is complete.

Until the reset is detected by decision block 59, the existence of the high spike is preferably continually communicated to the user as indicated in the block 58. The reset signal may be produced by a user in any well known manner, or by any well known automatic reset circuit such as one to be later described. After the reset is received, the detector returns to state block 50, the idle state, where it awaits the next input transition to the high state.

The low' signal 45, illustrated in FIG. 6, is used as an input to a low spike detector (not shown in FIG. 6 or 7) whose method of operation is illustrated in the flowchart of FIG. 8. The principles of operation of this low spike detector are similar to those described with reference to the high spike detector of FIG. 7, with the exception that high transitions are replaced by low transitions. In particular, beginning in a state block 60 and decision block 61, the circuit remains in the state 60, wherein the low spike timer is continually reset while the decision indicated in the decision box 61 is made, as to whether or not the input signal 20 is in the low state.

After a transition of the input signal 20 from the high or float states to the low state, the low spike detector enables the low spike timer as shown in block 62. The low spike detector is continually enabled until a decision box 64 determines that input signal 20 is no longer in the low state. Once the input signal 20 moves from the low state into the float or high state, the detector exits from the block 62 and the decision block 64, and makes the decision illustrated in the box 66, the decision being whether or not the low spike time 37 has been exceeded.

The low spike time 37, illustrated in FIG. 3, is a predetermined time period that preferably is selected by the user. From the decision box 66, the detector moves back to the state block 60 if the low spike time 37 has been exceeded (i.e., a low spike has not occurred), or to a block 68 if it has not been exceeded. In the latter case, a voltage spike has been detected, and communication of this event is accomplished in a block 68. In the preferred embodiment, the low spike detector remains in block 68 communicating the spike, until such time as a reset signal is received. The reset signal may be produced by any well known automatic reset circuit such as one to be later described.

One preferred embodiment of a high spike detector circuit for implementing the method of FIG. 7 is illustrated in FIG. 9, being generally designated at 76. A preferred embodiment of a low spike detector circuit for implementing the method of FIG. 8 is also illustrated in FIG. 9 and generally designated at 78.

Referring to FIG. 9, an enable signal 79 is provided as an input to both a high spike time gate 87a and a low spike time gate 87b so that both of the spike detection circuits are disabled unless the signal on the enable input 79 is in the high state. In other words, the high spike time gate 87a and low spike time gate 87b each function in response to the enable signal 79 as an on/off switch for their respective high or low spike fault detector. Of course, it will be appreciated by those skilled in the art that other methods and apparatus for switching the detectors 76, 78 on and off could also be used in this circuit, and that they could be switched separately.

The operation of the detector circuits 76, 78 will be understood more fully in light of the following discussion where it will be assumed that the enable signal 79 is in the high state. Referring first to the high spike detector 76 in FIG. 9, the output of an invertor 80a is connected to a variable ramp generator circuit indicated generally at 84a. The high' signal 49 is connected to the input of invertor 80a so that when the high' signal 49 goes low (i.e., the input signal 20 becomes high), the variable ramp 84a is enabled and the voltage on an output line 85a from ramp 84a begins to rise. The high' signal 49 is also connected to a clock input of a positive-edge-triggered D-type flip-flop 86a so that, substantially simultaneously with the start of the ramp 84a, the clock input to the flip-flop 86a drops low.

The variable ramp 84a will continue to raise the voltage on the line 85a while the input signal 20 of FIG. 6 is high. The voltage on line 85a will stop rising only when the input signal 20 leaves the high state. The line 85a is connected to an input of a comparator 88a, and a voltage reference 89 is connected to another input of the comparator 88a so that when the voltage on the line 85a is less than the voltage reference 89a, an output of the comparator 88a on a line 90a will produce a high signal. Therefore, the voltage of the output line 90a of comparator 88a is initially high. However, if the input signal 20 remains high for a sufficient time interval, the ramp 84a will increase the voltage on the line 85 to attain the level of voltage reference 89, and then the voltage of output line 90a of the comparator 88 will drop to the low state indicating that the selected high spike time 31 has expired. In the preferred embodiment, the voltage reference 89 remains at a fixed voltage and the ramp current source is adjustable to vary the high spike time 31. In other embodiments, the voltage reference 89 may be adjustable to vary the high spike time period 31.

The output 90a is connected to an OR gate 91a whose output is connected to the data input of the flip-flop 86a. Thus, ignoring for the moment the signal on a line 92a which connects the output of flip-flop 86a with the data input of the same flip-flop, the voltage on the output line 90 is passed through to the data input of the flip-flop 86a.

It must be remembered that the D-flip-flop 86a is positive edge triggered, so that upon the initial transition of the input signal 20 to high, the clock input to the flip-flop 86a, which is connected to high' 49, will become low and the data will not clock through. Upon the subsequent transition of the input signal 20 from the high state, the high' signal 49 will become high, and the value at the data input will then clock through to an output line 93a.

Because the voltage on the output line 90a is initially high, the data input to the flip-flop 86a will also be initially high, immediately after the initial transition to the high state. Therefore, if the time interval of a transition of the input signal 20 into, and then out of the high state does not allow ramp 84a to reach the voltage reference 89, a high value will be clocked through output 93a indicating detection of a spike fault when the transition of the input signal 20 from the high state occurs. If, however, the time interval during which the input signal 20 remains in the high state is sufficiently long to allow the ramp 84 to attain an output voltage on the line 85a greater than voltage reference 89, a low value will be clocked through to the output 93a.

The purpose of the line 92a can now be explained. Once a spike has been detected, the high value appearing on the line 93a is fed back to the data input through the line 92a. Thus, the output 93a of flip-flop 86a will remain high throughout all subsequent transitions of the input signal 20, until reset. To provide the capability to reset the flip-flop 86a, a spike clear signal 94 is provided to a clear input on the flip-flop 86a so that a clearing of the flip-flop 86a may be actuated by an appropriate clear signal 94 which may be produced by any conventional method of producing a clear signal such as by manual switch activation.

The variable ramp 84a may comprise any of several well known circuits. For example, a preferred embodiment of the variable ramp 84a comprises a pnp transistor 100a whose base is connected to the output of the high spike time gate 80a which resultantly transmits the value of the high' signal 49 to the base of the transistor 100a. The emitter of the transistor 100a is connected to a supply voltage 101a (preferably minus 5 volts if ECL technology is used), and the collector is connected to a variable current source 102a, a capacitor 104a, and to the line 85a connected to the comparator 88a. The other side of the capacitor 104a is connected to a ground 106. The variable current source 102a is connected to a voltage source (not shown) to receive its operating power. In the preferred embodiment, current source 102a may be adjusted by the user to select the amount of current provided by that source 102a, in order to control the duration of the high spike time 31, shown in FIG. 2.

When the high' signal 49 is inactive (i.e., high), the timer is not operating because a low voltage is being applied to the base of transistor 100a, thereby causing substantially all current from the variable current source 102a to flow through the transistor 100a. After the input signal 20 becomes high (i.e., high' 49 goes low and the output of invertor 80a goes high), the transistor 100a becomes substantially an open circuit, thereby forcing the current to flow through capacitor 104a, which with increasing time, causes the voltage 85a to rise. As previously described, if the input signal 20 remains high a sufficient time, the voltage on line 85a will rise to the level of voltage reference 89, thus causing the output 90a of comparator 88a to drop to the low state. Although not shown in the drawings, one skilled in the art will recognize that the accuracy of the timing range 84a will be improved if the actual value of the reference voltage 89 is compensated to allow for differences in the starting voltage of ramp 84a that arise from causes such as changes of temperature or current from the source 102a. Devices and methods for accomplishing such compensation are well known in the technology.

The low spike detector, indicated generally at 78, comprises low spike time invertor 80b, variable ramp 84b, line 85b, comparator 88b, output line 90b, OR gate 91b, line 92b, flip-flop 86b, output line 93b, transistor 100b, voltage reference 101b, variable current source 102b, capacitor 104b and ground 106. The connections and method of operation of the low spike detector are identical with those of high spike detector 76, except that the low' signal 45 is used as an input to low spike invertor 80b, and therefore detector 78 detects low spikes. Preferably, voltage reference 89 is identical for both detectors 76, 78; however, this is not necessary because each detector 76, 78 can function independently. Furthermore, the low spike time period 37 may be selected independently of the high spike time period 31 by, for example, varying current source 102b independently from current source 102a.

The output 93a of high spike detector 76 is connected to an input of an OR gate 108, and the output 93b of low spike detector 78 is connected to an input of the OR gate 108 so that a high signal appears on an output line 110 of OR gate 108 when a spike has been detected by either of the detectors 76, 78. Using the Motorola 10K ECL Series, spike faults 32 or 38 (shown in FIGS. 2 and 3) as narrow as 3 nsec can be detected. Furthermore, the high spike time 31 in FIG. 2, and the low spike time 37 in FIG. 3 can be adjusted to less than 10 nsec. It will be apparent to those skilled in the art that substitution of faster digital technology currently available will shorten the minimum time for detecting a spike such as spike fault 32 or 38, and further reduce the minimum time to which the spike times 31,37 can be adjusted.

Referring now to FIG. 10, the method of operation of the float detector may be described. Beginning with a state box 120 indicating the state where the float timer is reset, and a decision block 121, which tests for a transition into the float state, the float timer remains continually reset (i.e., "off") until the input signal 20 makes a transition into the float state. When this transition occurs, the float detector moves to a block 122 where the float timer is enabled or turned on.

While the timer is enabled, a decision block 124 continually tests for a transition of the input signal 20 from the float state. Furthermore, while the input signal 20 remains in the float state, the circuit also continually performs the test of the decision block 126, whether or not the float time has been exceeded. If the float time has not been exceeded, the float detector continually remains in the state 122 with the float timer enabled and performs the test of the boxes 124, 126. Thus, the circuit may exit this loop through either of the decision boxes 124, 126.

If the input signal 20 makes a transition to high or to low before the float time 24 is exceeded, the float detector exits from block 124 and returns to the state block 120, where the circuit resets the float timer and returns it to its initial condition. The block 120, the idle state, is the initial starting point for the float detector.

If, however, while still in the box 122, the float time 24 is exceeded before the input signal 20 makes the transition out of the float state, the float detector moves to a block 128, where the float detector communicates the float fault to an output device (not shown in FIG. 10). The float detector then remains in the block 128, communicating the float fault until the float fault has been communicated. After such communication, the float detector is "reset" and returns to the block 120, the reset state, and functions as described above.

The implementation of one preferred embodiment of the float detector of FIG. 10 is illustrated in FIG. 11. An enable' signal 138, which may comprise any of an infinite variety of digital waveforms, is provided to enable the float fault detector. The enable' signal 138 is inverted and provided to a float time AND gate 140 which essentially functions as an on/off switch for the float fault detector because a high output of AND gate 140 is not possible unless the enable' signal 138 is low. The float time gate 140 has another input that is inverted and connected to the float' signal 47, so that, after the enable' signal 138 becomes active (i.e., low), and when the float' signal 47 becomes active (i.e., low), gate 140 outputs a high signal.

The output of the gate 140 is connected to a variable ramp indicated generally at 142 whose components, connections and method of operation is identical with that previously described in connection with the variable ramp 84a,b of the spike fault detector illustrated in FIG. 9. In other words, the variable current source 144 of the float fault detector corresponds to the source 102a and 102b of the spike fault detector (FIG. 9). Similarly, transistor 145 corresponds to transistors 100a and 100b, voltage reference 146 corresponds to voltage references 101a and 101b, capacitor 147 corresponds to capacitors 104a and 104b, and ground reference 148 corresponds to ground reference 106 (all of FIG. 11 and FIG. 9, respectively).

An output line 150 of variable ramp 142 is connected to a comparator 152 whose output is connected to a clock input of a flip-flop 155, which is preferably a D-type positive-edge triggered flip-flop. A clear input to the flip-flop 155 is connected to a clear, signal 156, and a data input of the flip-flop 155 is connected to a voltage source 157 corresponding to the high state. A float error is indicated by a high state on an output line 158 from the flip-flop 155.

To illustrate the operation of the float detector shown in FIG. 11, initially it will be assumed that flip-flop 155 has been cleared by transmitting the appropriate clear signal 156 to the clear input of flip-flop 155. Furthermore, it is assumed that the comparator 152 is connected as above-described to the output 150 and to the voltage reference 153, so that the state appearing on the output line 154 is initially low.

After the circuit has been enabled by application of a low voltage to the enable' signal 138, and the float' signal 47 becomes active (i.e., goes low), a high signal is applied to variable ramp 142. This causes the voltage at the output 150 from the variable ramp 142 to begin rising. If the input signal 20 makes a transition from the float state before the voltage on the line 150 has risen to the level of the reference voltage 153, the output of the comparator 152 will remain low on its output line 154. However, if the input signal 20 does not make a transition to the float state before the voltage 150 attains the level of the reference voltage 153, the output line 154 of the comparator 152 will switch to the high state, clock the flip-flop 155 and cause the output line 158 to become high, indicating that input signal 20 remained in the float state longer than the float time. It should be noted that the output 158 will remain high until such time as the flip-flop 155 has been cleared by utilizing the clear signal 156.

As an additional illustration of the operation of the float detector of the present invention, FIG. 12 illustrates a timing diagram of voltages at various locations in the circuit. FIG. 12a shows an exemplary float' signal 47 input to the float detector. The following FIGS. 12b-12f illustrate, respectively, exemplary signals for: the enable' signal 138; the output line 150 of the variable ramp 142; a signal on the output line 154 of the comparator 152; a signal on the output 158 of the flip-flop 155; and the clear signal 156, with time plotted on the horizontal axis, and voltage plotted on the vertical axis.

By comparing the enable' signal 138 at times 173, 175, 177 and 179 with the voltages on lines 150, 154, and 158, it is apparent that the float' signal 47 does not affect the output voltages illustrated in FIGS. 12c, 12d and 12e until the float detector has been enabled. After enablement as indicated by transition 159, it is possible for the float' signal 47 to turn on the time gate 140 and start the float time ramp 142 as evidenced by the voltage on output line 150 of variable ramp 142.

Specifically, at a transition 160a of the float' signal 47, it can be seen that the ramp voltage 150 begins to increase, which in this instance does not attain the reference voltage 153 as illustrated by the dotted line because the float transition 160a to 160b occurs in a sufficiently short time interval. Continuing now to a transition 161a, however, the time to transition 161b is sufficient to increase ramp voltage 150 beyond the reference voltage 153. In that case, the output voltage 154 clocks the flip-flop 155 which then causes the voltage on the output of the line 158 of the flip-flop 155 to go high. Thus, the float detector remains in the high state until the flip-flop 155 has been cleared by any well known means such as the clear signal 156.

Using the Motorola 10K ECL Series, the duration of the maximum acceptable float time 24 as shown in FIG. 4 can be adjusted to as short as 3 nsec. It will be apparent to those skilled in the art that substitution of faster digital technology currently available will allow the maximum acceptable float time 24 to be adjusted to an even shorter time period.

A third type of error detected by the present invention is the noise error as illustrated in FIG. 5 where the signal either (1) drops from the high state to the float state and then returns to the high state without ever entering the low state, or conversely, (2) leaves the low state and returns to the low state without ever entering the high state.

The operation of the noise detector of the present invention is illustrated in the flowchart of FIG. 13. The binary digits inside boxes 163, 164, 165 and 166 indicate states associated with the particular loop through decision blocks. These state values will be particularly useful in explaining the implementation of the circuit in later discussion.

Operation of the noise detector circuit is described by initially referring to the state block 163, indicating the "00" state where the detector tests in a decision box 162 for a transition of the input signal 20 of FIG. 6 from the high state to the float state. For purposes of explanation, it is assumed that the input signal 20 makes a transition from the high state whereupon the circuit then proceeds to a state box 164 indicating the 01 state. The circuit, in this state 01, tests in a decision block 167 for whether or not the input 20 is in the low state. If the input signal 20 is not in the low state, the noise detector performs the test of a block 168 which tests for a return of input signal 20 to the high state.

Upon the initial transition from the block 162 into the state 01 (box 164), the input signal 20 will be in the float state because input signal 20 cannot go from the high state to the low state without passing through the float state. Thus initially, the circuit remains in the state 01 (box 164) while concurrently testing for either a transition to low in the box 167, or a transition to high in the box 168. The noise detector stays in the block 164 and performs tests 167, 168 until the input signal 20 changes to low. If the input signal 20 first becomes low then the float detector will exit this state 01 at the decision block 167, and the noise detector would then flow to the box 166 indicative of the state 11, where a decision block 171 tests for a transition from the low state to the float state. Thus, in the transition from state 01 to state 11, no noise error would have occurred. If, however, while still in state 01 (box 164) the input signal 20 becomes high, the detector generates the conditional output of box 169 which reports the noise error.

Since the conditional output, "report noise error signal," is only momentary, some latching mechanism, such as a flip-flop, must be employed to hold the noise error until it has been received by any suitable utilization device. In the preferred embodiment as will be described, the noise flip-flop stays set until it is reset, either manually or by any other well known means. Other embodiments may allow for reporting of the noise error without the need for this flip-flop and the accompanying need to reset the flip-flop. While the input signal 20 is high, the circuit remains in state 01 (box 164).

If, beginning in state 00 (box 163), the input signal 20 is initially low instead of high, the noise detector immediately exits state 00 (box 163) through the decision box 162, enters state 01 (box 164) and then immediately exits the state through the decision box 167, to arrive at the box 166, indicative of the state 11. As previously discussed in state 11 the detector continually tests in the decision box 171 for a transition from the low state to the float state. When such a transition is made to the float state, the noise detector moves to a box 165 indicative of state 10. In this state 10, the decision box 172 tests whether the input signal 20 is in the high state, and if not, tests whether the input signal 20 is in the low state.

The noise detector remains in state 10 (box 165) and performs the tests of boxes 172 and 174 while the input signal 20 remains in the float state. When the input signal 20 becomes high, as in normal operation, the detector exits state 10 at the decision box 172, and returns to the box 163 indicative of state 00. In the other case, when the input signal 20 becomes low, a noise error has occurred, and the detector generates the conditional output of box 176 which reports the noise error. The detector then remains in state 10 (box 165), performing tests 172 and 174 and generating the conditional output of box 176 if the input signal 20 becomes low, until the input signal 20 becomes high, whereupon the detector exits the box 165 through the box 172 and returns to state 00 (box 163). As Was described above, the "report noise error" signal may be only momentary, and some latching mechanism such as a flip-flop must be employed to hold the noise error signal until it is received by any suitable utilization device as noted above. The preferred embodiment to be described comprises a noise flip-flop to hold the error signal until it is reset.

As noted above in connection with the portion of the noise detector that detects a transition from high to float to high, other embodiments (not described) may comprise alternate means of reporting the noise error, and may not in fact use a noise flip-flop.

As was indicated above, the rectangular blocks 163, 164, 165, 166 refer to definite states of circuit operation. Specifically, in block 163, the state 00 is a state in which the signal is high either initially, or after a proper transition. State 00 is not exited until the decision noted in the block 162 (a transition out of the high state) has occurred. After that transition, the float detector moves to the block 164, corresponding to the state 01. When the float detector is in the state 01, the circuit is in a loop including the decision blocks 167,168 which state continues until the state of the input signal 20 changes either to high or to low.

Another state, the state 11 illustrated in block 177, is the state wherein the signal is low either initially or after a proper transition. The circuit remains in the state 11 until the input signal 20 changes to the float state, after which the float detector moves to a state 10, including decision blocks 172, 174 and loops through those blocks 172, 174 in state 10 until the next transition into the high or the low state.

FIG. 14 illustrates one preferred embodiment of a noise fault detector circuit for implementing the method illustrated in the flowchart of FIG. 13. This embodiment comprises a low' buffer 184 whose input is inverted and connected to the low' signal 45, and a buffer-invertor gate 186 whose input is inverted and connected to the high' signal 49. An enable signal 206 is connected to the data input of a flip-flop 188, and a clear signal 208 is connected to the reset or clear input of the flip-flip 188. An output line 209 of the flip-flop 188 is provided, and indicates detection of a noise error, as will be described.

The output of the low' buffer 184 is connected to an inverted input of an OR gate 180, an inverted input of an AND gate 198, and an inverted input of a low fault AND gate 200. The output of the high' invertor gate 186 is connected to inverted inputs of AND gates 192 and 194, and an inverted output of the invertor buffer gate 186 is connected to an inverted input of a high fault AND gate 202. The output of the AND gate 192, is connected to an input of an OR gate 180; the outputs of the AND gates 194, 196 and 198 are each connected to a separate input of OR gate 182; and the outputs of the AND gates 200, 202 are each connected to a separate input of an OR gate 204. A non-inverted output of the OR gate 180 labeled Q1 is connected to an inverted input of AND gate 194, to an inverted input of AND gate 196, and to an inverted input of the AND gate 202. Furthermore, the output of the OR gate 180 labeled Q1' (the inverted value of the output Q1) is connected to an inverted input of the AND gate 192, and to an inverted input of the AND gate 200.

The output of the OR gate 182 labeled Q0 is connected to an inverted input of the AND gate 200. The output of the OR gate 182 labeled Q0' (the inverted output Q0) is connected to an inverted input of AND gate 202, to an inverted input of AND gate 196, and to an inverted input of AND gate 198. An output of the OR gate 204 is connected to the clock input of positive edge-triggered D-flip-flop 188.

Turning now to the flowchart of FIG. 13, the state digits (those digits inside rectangular blocks 163, 164, 165 and 166) correspond directly to the outputs Q0 and Q1 of OR gates 180, 182 in FIG. 14. The output of OR gate 180 represents the left digit, or Q1. The output of OR gate 182 represents to right digit, or Q0. Thus, in the preferred embodiment, Q1 and Q0 are described by the following logic.

$$Q1 = (\text{low' signal 45})' + (Q1 * \text{high' signal 49})$$
$$Q0 = (Q1' * \text{high' signal 49}) + (Q1' * Q0) + (Q0 * \text{low' signal 45})'$$

The above equations are implemented by the circuitry illustrated in FIG. 14.

Because each combination of Q1 and Q0 relates directly to that state noted in the rectangular blocks 163, 164, 165 and 166 of FIG. 13, a low fault is detected if in state 10, the input signal 20 drops low. Thus, the three inverted inputs of the low fault AND gate 200 are the outputs of the OR gate 180 (Q1'), OR gate 182 (Q0'), and the output of the low buffer 184, so that low fault AND gate 200 is high only when Q1 is high, Q0 is low, and the input is low. Using a similar process, a high fault is detected if in state 01 the signal becomes high. Therefore, the three inverted inputs of high fault AND gate 202 are the outputs of the OR gates 180 (Q1) and OR gate 182 (Q0') and inverted output of the high buffer 186, so that the high fault OR gate 202 outputs the high value indicating a fault only when Q1=0, Q0=1, and the input is high.

In the described embodiment, the output of the low fault AND gate 200 and the high fault AND gate 202 are OR'd together in the OR gate 204 and then used as an input to clock the D-flip-flop 188 which has an output on the line 209. Initially, before the circuit begins operation, the D-flip-flop 188 is assumed clear (i.e., the output on the line 209 is low). After enablement, the data input of the D-flip-flop 188 is high, but the output on the line 209 is still low. Upon a positive transition of the clock input (as a result of a transition of the OR gate 204) a high value is clocked through to the output on the line 209 to indicate that a noise fault has been detected. It will be clear to one skilled in the art that high noise faults can be detected separately from low noise faults by eliminating OR gate 204 and connecting the outputs of the two AND gates 200 and 202 to the clock inputs of two separate flip-flops. Of course, the two noise detectors could be enabled separately as well.

In the preferred embodiment, a single electrical component, for example, a MC 10117 manufactured by Motorola may be used to implement AND gates 192 and OR gate 180. Furthermore, a single electrical component, for example, a MC 10121 manufactured by Motorola may be used to implement AND gates 194, 196, 198 and OR gate 182, and another MC 10121 may implement AND gates 200, 202 and OR gate 204. It has been found that the use of these components enhances the speed of the noise detector circuit above the speed possible if the circuit were to be made of individual AND gates and OR gates.

Using these components, the minimum time duration for detecting a noise fault is less than 3 nsec. It will be appreciated by those skilled in the art that shorter minimum time periods can be realized by using faster digital technology that is currently available.

In light of the above discussion, one skilled in the art will recognize that each of the three described outputs provides a signal indicative of a particular type of fault. These three outputs include: the spike fault signal on the line 110 discussed in connection with the circuit of FIG. 9, the float fault signal on the line 158 discussed in connection with circuit of FIG. 11, and the noise fault signal on the line 209 discussed in connection with circuit of FIG. 14.

In one preferred embodiment of the present invention incorporating these circuits, each output is connected to another device will be described further in connection with FIG. 15. For example, each output may be connected to a conventional counter circuit and additional logic will clear the respective fault flip-flop after counting has been assured. It is recognized that the clearing of the individual flip-flop must be delayed a sufficient time to allow for counting the fault detection signal from the individual flip-flop. Thus, it is recognized that there will be a time delay after the actual detection of the fault, due to the time necessary to both count and clear the flip-flop. This delay could cause a series of faults occurring in a short time span to be counted as a single fault; however, at least one fault will be reported so no single fault or burst of faults will go unreported.

It is expected that any error in the total number of faults will be minimal and that the user will take this possibility into account or use any one of several well known instruments for analyzing digital signals in conjunction with this invention (as described below) for analyzing the faults more thoroughly. In alternative embodiments, two separate circuits may (1) count the fault and (2) clear the flip-flop, the clear circuit being delayed sufficiently that the individual flip-flop is cleared only after counting of the fault has been assured.

Reference is now made to FIG. 15, which illustrates one preferred embodiment of the present invention. In the embodiment of FIG. 15, the spike detector shown in FIG. 9 is illustrated in a block 222 having the output 110, the float detector shown in FIG. 11 is illustrated in a block 224 having the output 158, and the noise detector shown in FIG. 14 is illustrated in a block 226 having the output 209. Each fault signal appears respectively on the lines 110, 158, 209, and is connected to a control unit 211 and to a counter 210 which may be controlled in some respect, such as enabling the output, by the control unit 211. The counter 210 counts the faults using any of the various well known counting devices and techniques.

In the preferred embodiment, control unit 211 comprises a microprocessor and associated circuitry which includes data storage capabilities. Although shown separately, the counter 210 may be incorporated into the microprocessor or software. Using the counter 210, the number of spike faults on the output 110, the number of float faults on the output line 158, and the number of noise faults on the output line 209 can be totalled and stored.

The control unit 211 is also connected, through a reset circuit 212 to the Spike Flip-Flop Clear 94, Float Flip Flop Clear 156, Noise Flip-Flop Clear 208, so that after counting, the control unit 211 can provide a signal to clear the respective flip-flop detecting the fault. Although shown separately, the control unit 211 and the reset circuit 212 may be incorporated into a single microprocessor.

It will be apparent to those skilled in the technology that some or all of the operations performed by the counter 210, the control circuit 211 and the reset circuit 212 may be incorporated into a single microprocessor, and may be embodied in a single semiconductor chip, or in a series of such chips.

A user station 220 such as a keyboard is connected to the control unit 211 in order to access the control unit. By entering a sequence of keystrokes, various operations can be performed, such as the counting operation previously described.

The control unit 211 is also connected to a display 214 such as, for example, an LED or a CRT display. Thus, the user, at any desired time, by interfacing through user station 220 with the control unit 211 may display data such as the accumulated number of faults of each type. The characters displayed on display 214 may, for example, comprise a collection of numbers showing separately the number of spike faults, the number of float faults, and the number of noise faults or any combination or sequence thereof. By entering a sequence of keystrokes on the user station 220, the user may also program the control unit 211 to perform a wide variety of functions. For example, the display operation may be programmed so that the number of faults of each type appear continuously in time, as they occur.

Because the control unit 211 is programmable, a computer programmer skilled in the art can implement a wide variety of operations, for example, monitoring to detect a particular sequence of faults and providing an output upon such occurrence. As an example of another operation that may be implemented, each fault can be associated with the time at which it occurs by, for example, recording the time of a system clock in association with each fault. Furthermore, statistical information may be derived from this data, such as the number of faults, the time of their occurrence, or any particular combination of faults or occurrences.

Additionally, in alternative applications, the control unit 211 may be connected to another device, such as the logic analyzer 216 or any other device found to be useful in analyzing digital signals. Upon the existence of a fault, or a sequence of faults, the control unit 211 can apply a signal to this device to trigger it (stop, start, or synchronize it) so that the potential problem can be analyzed in detail. For example, triggering the logic analyzer 216 would permit the fault to be associated with other data available from the circuit and may be useful in determining the cause of the fault and its time relative to other circuit characteristics. More specifically, the present invention may be connected to a logic analyzer or other device, so as to trigger upon any particular fault, or any particular combination of faults, so that the logic analyzer will begin collecting data when a fault is detected or upon the particular series or combination of faults selected. With this information, a troubleshooter can more clearly focus on the events surrounding the occurrence of the particular problem.

In summary, the present invention provides an electrical circuit that continuously monitors a digital signal. The present invention comprises circuits that can substantially continuously test for the existence of high and low spike faults, float faults, and noise faults, and provide fault data to circuits subsequent thereto. The fault data can then be viewed by the user, processed in some manner, or otherwise used as desired, such as to trigger another device.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced with their scope.

What is claimed and desired to be secured by United States Letters Patent is:

1. An electrical testing device, comprising:
a float fault detector;
a control unit connected to said float fault detector; and
a counter connected to said control unit and also connected to said float fault detector.

2. The electrical testing device as defined in claim 1, further comprising a reset circuit to reset the float detector after a fault signal has been detected by the float fault detector and communicated to the counter.

3. The electrical testing device as defined in claim 1, further comprising a user station connected to the control unit, whereby a user may direct any of a series of operations to be performed using data stored in said counter.

4. The electrical testing device as defined in claim 1, further comprising a spike detector connected to the control unit and the counter.

5. The electrical testing device as defined in claim 4, further comprising:
a first reset circuit to reset the float detector after a fault signal has been detected by the float fault detector and communicated to the counter; and
a second reset circuit to reset the spike detector after a fault signal has been detected by the spike fault detector and communicated to the counter.

6. The electrical testing device as defined in claim 4, further comprising a user station connected to the control unit, whereby the user may direct any of a series of operations to be performed using data stored in said counter.

7. An electrical testing device, comprising:
a noise fault detector;
a control unit connected to said noise fault detector; and
a counter connected to said control unit and also connected to said noise fault detector.

8. The electrical testing device as defined in claim 7, further comprising a reset circuit to reset the noise detector after a fault signal has been detected by the float fault detector and communicated to the counter.

9. The electrical testing device as defined in claim 7, further comprising a user station connected to the control unit, whereby a user may direct any of a series of operations to be performed using data stored in said counter.

10. The electrical testing device as defined in claim 7, further comprising a spike detector connected to the control unit and the counter.

11. The electrical testing device as defined in claim 10, further comprising a float fault detector connected to the control unit and the counter.

12. An electrical testing, device for detecting the quality of a signal in a digital circuit, said testing device comprising:

means for selecting a voltage threshold, said means defining a voltage separating a first voltage range from a second voltage range;
means connected to the selecting means for monitoring the signal to determine whether the signal is in the second voltage range;
means connected to the monitoring means for measuring a first time period during which the signal is substantially continuously within said second voltage range;
means for defining a second time period;
means for comparing the first time period with the second time period; and
means responsive to said comparison means for communicating that the duration of the first time period is shorter than the second time period.

13. An electrical testing device for detecting characteristics of a signal in a digital circuit having a high voltage threshold and a low voltage threshold, the signal being in a high state if said signal has a voltage above the high voltage threshold, and the signal being in a low state if said signal has a voltage less than the low voltage threshold, said testing device comprising:
means for defining a high spike time period;
means for defining a low spike time period;
means for monitoring the signal to identify when the signal is in the high state and when the signal is in the low state;
first timing means connected to said monitoring means for measuring a first time period during which the signal is substantially continuously in the high state;
second timing means connected to said monitoring means for measuring a second time period during which the signal is substantially continuously in the low state;
first duration comparison means connected to the first timing means and to the high spike time defining means for comparing duration of the first time period with the high spike time period;
first means responsive to the first duration comparison means for communicating that the duration of the first time period is shorter than the high spike time period, whereby a high spike is detected;
second duration comparison means connected to the second timing means and to the low spike time defining means for comparing duration of the second time period with the low spike time period; and
second means responsive to the second duration comparison means for communicating that the duration of the second time period is shorter than the low spike time period, whereby a low spike is detected.

14. The electrical testing device of claim 13, further comprising a means responsive to the first and the second communication means for storing an accumulated number of high spikes and low spikes detected.

15. The electrical testing device of claim 13, wherein the first time period is of the same duration as the second time period, and wherein the means for defining the first time period is connected to the means for defining the second time period so that the first and the second time periods are defined simultaneously.

16. The electrical testing device of claim 13, further comprising a control unit connected to the first and the second communication means.

17. The electrical testing device as defined in claim 13, wherein said first timing means includes a first ramp generator having a first ramp output responsive to the high state, so that an increasing duration of the first time period is associated with a rising voltage of the first ramp output, and wherein said second timing means includes a second ramp generator having a second ramp output responsive to the low state, so that an increasing duration of the second time period is associated with a rising voltage of the second ramp output.

18. The electrical testing device of claim 17, wherein the means for defining the high spike time period includes a first adjustable current source connected to the first ramp generator so that the rate of rise of the voltage on the output of the first ramp is responsive to said first adjustable current source, and wherein the means for defining the low spike time period includes a second adjustable current source connected to the second ramp generator so that the rate of rise of the voltage on the output of the second ramp is responsive to said second adjustable current source, whereby an adjustment of the respective current source also changes the rate of voltage rise on the output of the respective ramp generator.

19. The electrical testing device of claim 17, wherein the first comparison means includes a first comparator connected to the first ramp generator and also connected to a first reference voltage source, so that the output of said first comparator is responsive to the voltage difference between the first reference voltage and the first ramp output voltage, and wherein the second comparison means includes a second comparator connected to the second ramp generator and also connected to a second voltage source so that the output of said second comparator is responsive to the voltage difference between the second reference voltage and the second ramp output voltage.

20. The electrical testing device of claim 19, wherein the first reference voltage substantially equals the second reference voltage.

21. The electrical testing device of claim 19, wherein the means for communicating the event that the duration of the first time period is shorter than the high spike time period, and the means for communicating the event that the duration of the second time period is shorter than the low spike time period includes a fault indicator electrical component that, responsive to either of said events, outputs a spike indicator signal indicating a spike fault.

22. The electrical testing device of claim 21, further comprising a means for storing the accumulated number of spikes detected, said means being connected to the fault indicator.

23. The electrical testing device of claim 22, further comprising a control unit connected to the storage means for controlling the recording of detected spikes.

24. An electrical testing device for detecting characteristics of a signal in a digital circuit having a high voltage threshold and a low voltage threshold, the signal being in high state if said signal has a voltage above the high voltage threshold, the signal being in a float state if said signal has a voltage between the high voltage threshold and the low voltage threshold, and the signal being in a low state if said signal has a voltage less than the low voltage threshold, said testing device comprising:
means for defining a high spike time period;
means for defining a low spike time period;
means for defining a float time period;
means for monitoring the signal to identify when the signal is in the high state, when the signal is in the float state, and when the signal is in the low state;
first timing means connected to said monitoring means for measuring a first time period during which the signal is substantially continuously in the high state;
second timing means connected to said monitoring means for measuring a second time period during which the signal is substantially continuously in the low state;
third timing means connected to said monitoring means for measuring a third time period during which the signal is substantially continuously in the float state;
first duration comparison means connected to the first timing means and to the high spike time defining means for comparing duration of the first time period with the high spike time period;
means responsive to the first duration comparison means for communicating that a high spike has been detected when the duration of the first time period is shorter than the high spike time period;
second duration comparison means connected to the second timing means and to the low spike time defining means for comparing duration of the second time period with the low spike time period;
means responsive to the second duration comparison means for communicating that a low spike has been detected when the duration of the second time period is shorter than the low spike time period;
third duration comparison means connected to the third timing means and to the float time defining means for comparing duration of the third time period with the float time period; and
means responsive to the third duration comparison means for communicating that a float fault has been detected when the duration of the third time period is longer than the float time period, whereby a float fault is detected.

25. The electrical testing device of claim 24, wherein the first, the second and the third timing means each comprise a respective first, a second and a third ramp generator.

26. The electrical testing device of claim 24, further comprising means responsive to the first, the second and the third communication means for separately storing an accumulated number of high spikes, low spikes and float faults detected.

27. The electrical testing device of claim 24, wherein the first time period is of the same duration as the second time period, and the means for defining the first time period is connected to the means for defining the second time period so that the first and the second time periods are defined simultaneously.

28. The electrical testing device of claim 24, wherein said testing device further comprises:
means for detecting a low-to-float transition of the signal from the low state into the float state;
means for detecting a float-to-low transition of the signal from the float state into the low state;
means for detecting a float-to-high transition of the signal from the float state into the high state;
means responsive to the low-to-float, float-to-low and float-to-high transition detection means for detecting a low noise fault wherein the occurrence of the low-to-float transition is next succeeded by a float-to-low transition; and a fourth means responsive to the low noise fault detection means for communicating that the low noise fault has occurred.

29. The electrical testing device of claim 24, wherein said testing device further comprises:
    means for detecting a high-to-float transition of the signal from the high state into the float state;
    means for detecting a float-to-low transition of the signal from the float state into the low state;
    means for detecting a float-to-high transition of the signal from the float state into the high state;
    means responsive to the high-to-float, float-to-low and float-to-high transition detection means for detecting a high noise fault wherein the occurrence of the high-to-float transition is next succeeded by a float-to-high transition; and
    fourth means responsive to the high noise fault detection means for communicating that the high noise fault has occurred.

30. The electrical testing device of claim 29, wherein the testing device further comprises:
    means for detecting a low-to-float transition;
    means responsive to the low-to-float, float-to-high and float-to-low transition detection means for detecting a low noise fault wherein the occurrence of the low-to-float transition is next succeeded by a float-to-low transition; and
    fifth means responsive to the low noise fault detection means for communicating that a low noise fault has occurred.

31. The electrical testing device of claim 30, further comprising a control unit connected to the first, the second, the third, the fourth and the fifth communicating means.

32. The electrical testing device of claim 30, further comprising means responsive to the first, the second, the third and the fourth communication means for separately storing the accumulated number of high spikes, low spikes, float faults and noise faults.

33. The electrical testing device of claim 24:
    wherein the first timing means includes a first ramp generator having a first ramp output responsive to the high state, so that an increasing duration of the first time period is associated with a rising voltage of the first ramp output;
    wherein the second timing means includes a second ramp generator having a second ramp output responsive to the low state, so that an increasing duration of the second time period is associated with a rising voltage of the second ramp output; and
    wherein the third timing means includes a third ramp generator having a third ramp output responsive to the float state, so that an increasing duration of the float time period is associated with a rising voltage of the third ramp output.

34. The electrical testing device of claim 33:
    wherein the means for defining the high spike time period includes a first adjustable current source connected to the first ramp generator,
    wherein the means for defining the low spike time period includes a second adjustable current source connected to the second ramp generator,
    wherein the means for defining the float fault time period includes a third adjustable current source connected to the third ramp generator, and
    wherein the rate of voltage rise on the respective output of the each ramp is responsive to the associated current source, such that an adjustment of said current source also changes the rate of voltage rise on the respective output of the ramp generator.

35. The electrical testing device of claim 33:
    wherein the first duration comparison means includes a first comparator connected to the first ramp generator, and also to a first reference voltage source, so that the output of said first comparator is responsive to the voltage difference between the first reference voltage and first ramp output voltage;
    wherein the second duration comparison means includes a second comparator connected to the second generator and also to a second reference voltage source, so that the output of said second comparator is responsive to the voltage difference between the second reference voltage and second ramp voltage; and
    wherein the third duration comparison means includes a third comparator connected to the third ramp generator and also to a third reference voltage source, so that the output of said third comparator is responsive to the voltage difference between the third reference voltage and the third ramp output voltage.

36. The electrical testing device of claim 35, wherein the first reference voltage is substantially equal to the second reference voltage.

37. The electrical testing device of claim 35, wherein the means for communicating the event that the duration of the first time period is shorter than the high spike time period, and the means for communicating the event that the duration of the second time period is shorter than the low spike time period comprises a first electrical component that, responsive to either of said events, outputs a spike indicator signal indicating a spike fault.

38. The electrical testing device of claim 37, wherein the means for communicating the event that the duration of the third time period is longer than the float time period comprises a second electrical component that, responsive to said event, outputs a float indicator signal indicating a float fault.

39. The electrical testing device of claim 37, further comprising a means for separately storing the accumulated number of spikes detected, said means being connected to the spike fault indicator.

40. The electrical testing device of claim 39, further comprising a control unit connected to the first, the second and the third communication means.

41. An electrical testing device for detecting characteristics of a signal in a digital circuit having a high voltage threshold and a low voltage threshold, the signal being in a high state if said signal has a voltage above the high voltage threshold, the signal being in a float state if said signal has a voltage between the high voltage threshold and the low voltage threshold, and the signal being in a low state if said signal has a voltage less than the low voltage threshold, said testing device comprising:
    means for detecting a high-to-float transition of the signal from the high state into the float state;
    means for detecting a float-to-low transition of the signal from the float state into the low state;
    means for detecting a float-to-high transition of the signal from the float state into the high state;
    means responsive to the high-to-float, float-to-low and float-to-high transition detection means for detecting a high noise fault wherein the occurrence of the high-to-float transition is next succeeded by a float-to-high transition; and fourth means responsive to the high noise fault detection means for communicating that the high noise fault has occurred.

42. The electrical testing device of claim 41, further comprising:

means for detecting a low-to-float transition;

means responsive to the low-to-float, float-to-high and float-to-low transition detection means for detecting a low noise fault wherein the occurrence of the low-to-float transition is next succeeded by a float-to-low transition; and fifth means responsive to the low noise fault detection means for communicating that the low noise fault has occurred.

43. An electrical testing device for detecting characteristics of a signal in a digital circuit having a high voltage threshold and a low voltage threshold, the signal being in a high state if said signal has a voltage above the high voltage threshold, the signal being in a float state if said signal has a voltage between the high voltage threshold and the low voltage threshold, and the signal being in a low state if said signal has a voltage less than the low voltage threshold, said testing device comprising:

means for detecting a low-to-float transition of the signal from the low state into the float state;

means for detecting a float-to-low transition of the signal from the float state into the low state;

means for detecting a float-to-high transition of the signal from the float state into the high state;

means responsive to the low-to-float, float-to-low and float-to-high transition detection means for detecting a low noise fault wherein the occurrence of the low-to-float transition is next succeeded by a float-to-low transition; and fourth means responsive to the low noise fault detection means for communicating that the low noise fault has occurred.

44. An electrical testing device for detecting characteristics of a signal in a digital circuit having a high voltage threshold and a low voltage threshold, the signal being in a high state if said signal has a voltage above the high voltage threshold, the signal being in a float state if said signal has a voltage between the high voltage threshold and the low voltage threshold, and the signal being in a low state if said signal has a voltage less than the low voltage threshold, said testing device comprising:

means for defining a high spike time period;
means for defining a low spike time period;
means for defining a float time period;
an input state discriminator for monitoring the signal to identify when the signal is in the high state and when the signal is in the float state, and when the signal is in the low state;

a high ramp generator connected to said input state discriminator for measuring a first time period during which the signal is substantially continuously in the high state;

a low ramp generator connected to said input state discriminator for measuring a second time period during which the signal is substantially continuously in the low state;

a float ramp generator connected to said input state discriminator for measuring a third time period during which the signal is substantially continuously in the float state;

a high comparator for comparing the duration of the first time period with the high spike time period;

an output device responsive to the output of the high comparator for communicating that a high spike has been detected when the duration of the first time period is shorter than the high spike time period;

a low comparator for comparing the duration of the second time period with the low spike time period;

an output device responsive to the low comparator for communicating that a low spike has been detected when the duration of the second time period is shorter than the low spike time period;

a float comparator for comparing the duration of the third time period with the float time period; and an output device responsive to the float comparator for communicating that a float fault has been detected when that the duration of the third time period is longer than the float time period, whereby a float fault is detected.

45. The electrical testing device of claim 44:

wherein the means for defining a high spike time period includes a first adjustable current source connected to the first ramp generator;

wherein the means for defining a low spike time period includes a second adjustable current source connected to the second ramp generator;

wherein the means for defining a float fault time period includes a third adjustable current source connected to the third ramp generator; and so that the rate of the voltage rise on the respective output of each of said ramps is responsive to the respective current source.

46. The electrical testing device of claim 44, wherein the means for communicating the event that the duration of the first time period is shorter than the high spike time period, and the means for communicating the event that the duration of the second time period is shorter than the low spike time period include a first electrical component that, responsive to either of said events, outputs a spike indicator signal indicating a spike fault.

47. The electrical testing device of claim 46, wherein the means for communicating the event that the duration of the third time period is longer than the float time period includes a second electrical component that, responsive to said event, outputs a float indicator signal indicating a float fault.

48. The electrical testing device of claim 44, further comprising a counter responsive to any of the first, the second and the third communication means for storing an accumulated number of high spikes, low spikes and float faults detected.

49. The electrical testing device of claim 44, further comprising a control unit connected to the first, the second and the third communication means.

50. The electrical testing device of claim 44, wherein said testing device further comprises:

means for detecting a high-to-float transition of the signal from the high state into the float state;

means for detecting a float-to-low transition of the signal from the float state into the low state;

means for detecting a float-to-high transition of the signal from the float state into the high state;

means responsive to the high-to-float, float-to-low and float-to-high transition detection means for detecting a high noise fault wherein the occurrence of the high-to-float transition is next succeeded by a float-to-high transition; and fourth means responsive to the high noise fault detection means for communicating that the high noise fault has occurred.

51. The electrical testing device of claim 50, wherein the testing device further comprises:

means for detecting a low-to-float transition;

means responsive to the low-to-float, float-to-high and float-to-low transition detection means for detecting low noise fault wherein the occurrence of the low-to-float transition is next succeeded by a float-to-low transition; and fifth means responsive to the low noise fault detection means for communicating that the low noise fault has occurred.

52. The electrical testing device of claim 51, further comprising a control unit connected to the first, the second, the third, the fourth and the fifth communicating means.

53. The electrical testing device of claim 44, wherein said testing device further comprises:

means for detecting a low-to-float transition of the signal from the low state into float state;

means for detecting a float-to-low transition of the signal from the float state into the low state;

means for detecting a float-to-high transition of the signal from the afloat state in to the high state;

means responsive to the low-to-float, float-to-low and float-to-high transition detection means for detecting a low noise fault wherein the occurrence of the low-to-float transition is next succeeded by a float-to-low transition; and fourth means responsive to the low noise fault detection means for communicating that the low noise fault has occurred.

54. A method for detecting characteristics of a signal in a digital circuit having a high voltage threshold and a low voltage threshold, the signal being in a high state if said signal has a voltage above the high voltage threshold, and the signal being in a low state if said signal has a voltage less than the low voltage threshold, said method comprising the steps of:

(1) defining a high spike time period;
(2) defining a low spike time period;
(3) monitoring the signal to identify when the signal is in the high state and when the signal is in the low state;
(4) measuring a first time period during which the signal is substantially continuously in the high state;
(5) comparing the duration of the first time period with the high spike time period;
(6) providing a signal if the duration of the first time period is shorter than the high spike time period, whereby a high spike is detected;
(7) measuring a second time period during which the signal is substantially continuously in the low state;
(8) comparing the duration of the second time period with the low spike time period; and
(9) providing a signal if the duration of the second time period is shorter than the low spike time period, whereby a low spike is detected.

55. A method for detecting characteristics of a signal in a digital circuit having a high voltage threshold and a low voltage threshold, the signal being in a high state if said signal has a voltage above the high voltage threshold, the signal being in a float state if said signal has a voltage between the high voltage threshold and the low voltage threshold, and the signal being in a low state if said signal has a voltage less than the low voltage threshold, said testing device comprising:

(1) defining a float time period;
(2) monitoring the signal to identify when the signal is in the high state, when the signal is in the float state, and when the signal is in the low state;
(3) measuring a float time period during which the signal is substantially continuously in the float state;
(4) comparing the duration of the third time period with the float time period; and
(5) providing a signal if the duration of the third time period is longer than the float time period, whereby a float fault is detected.

56. A circuit for detecting faults in a digital signal, said signal testing circuit comprising:

a discriminator circuit having the digital signal as an input, said discriminator circuit substantially continuously providing an output indicative of whether the digital signal is in a high state, a float state or a low state; and means coupled to the output of the discriminator for testing the digital signal for the occurrence of a spike fault, a noise fault and a float fault.

57. The digital signal fault detector of claim 56, further comprising means for digital data storage, and wherein triggering of said storage means is responsive to a spike fault, a noise fault or a float fault.

58. The digital signal fault detector of claim 56, further comprising:

means for counting a number of float faults detected;
means for counting a number of spike faults detected; and
means for counting a number of noise faults detected.

59. The digital signal fault detector of claim 58, further comprising means for digital data storage, and wherein triggering of said storage means is responsive to a sequence of one or more spike faults, noise faults, or float faults.

60. The digital signal fault detector of claim 56, wherein the testing means simultaneously tests the digital signal for the spike fault, the noise fault, and the float fault.

61. A method of triggering an electronic device, comprising the steps of:

(1) providing a fault detector that tests for a signal fault comprising at least one of a number of fault types including a spike fault, a float fault and a noise fault;
(2) providing an output signal from the signal fault detector, said signal being responsive to a detection of one or more signal faults; and
(3) applying the output signal to trigger the electronic device.

62. The method of claim 61, wherein the electronic device comprises a logic analyzer.

* * * * *

UNITED STATES PATENT AND TRADEMARK OFFICE
CERTIFICATE OF CORRECTION

PATENT NO. : 4,965,800
DATED : October 23, 1990
INVENTOR(S) : Farnbach

It is certified that error appears in the above-indentified patent and that said Letters Patent is hereby corrected as shown below:

Column 30, line 14, after "measuring a", insert --third--.

Signed and Sealed this

Twenty-eighth Day of September, 1993

Attest:

BRUCE LEHMAN

Attesting Officer

Commissioner of Patents and Trademarks